United States Patent
Urakami et al.

(10) Patent No.: US 7,564,095 B2
(45) Date of Patent: Jul. 21, 2009

(54) SEMICONDUCTOR DEVICE AND METHOD FOR MANUFACTURING THE SAME

(75) Inventors: Yasushi Urakami, Tokai (JP); Jun Sakakibara, Anjo (JP); Hitoshi Yamaguchi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 139 days.

(21) Appl. No.: 11/439,971

(22) Filed: May 25, 2006

(65) Prior Publication Data

US 2006/0286751 A1 Dec. 21, 2006

(30) Foreign Application Priority Data

Jun. 17, 2005 (JP) ............... 2005-177762

(51) Int. Cl.
*H01L 27/088* (2006.01)
(52) U.S. Cl. ............... 257/330; 257/329; 257/331; 257/332; 257/341; 257/401; 257/E29.118; 438/270; 438/272; 438/283
(58) Field of Classification Search ................. 257/341, 257/401, E29.118, 329–332; 438/283, 270, 438/272
See application file for complete search history.

(56) References Cited

U.S. PATENT DOCUMENTS

| | | | |
|---|---|---|---|
| 6,525,375 B1 * | 2/2003 | Yamaguchi et al. | ......... 257/341 |
| 6,670,673 B2 | 12/2003 | Sakakibara | |
| 6,696,323 B2 | 2/2004 | Yamaguchi et al. | |
| 6,867,456 B2 | 3/2005 | Sakakibara | |
| 7,030,457 B2 * | 4/2006 | Ahrens et al. | ............... 257/516 |

FOREIGN PATENT DOCUMENTS

JP A-10-223766 8/1998

* cited by examiner

*Primary Examiner*—Kenneth A Parker
*Assistant Examiner*—John Lin
(74) *Attorney, Agent, or Firm*—Posz Law Group, PLC

(57) ABSTRACT

A semiconductor device includes: a semiconductor substrate; an element region having a semiconductor element including an impurity layer and a trench, wherein the impurity layer is disposed in the trench, and wherein the trench is disposed on a main surface of the substrate; and a field region disposed around the element region. The trench is an aggregation of a plurality of stripe line trenches so that the element region has a polygonal shape. The field region includes a dummy trench disposed along with one side of the polygonal shape on a periphery of the element region. The dummy trench has a width and a longitudinal direction, which are equal to those of the trench. The field region further includes an impurity layer disposed in the dummy trench.

13 Claims, 21 Drawing Sheets

IIIA — IIIB

SEMICONDUCTOR DEVICE AND METHOD FOR MANUFACTURING THE SAME

CROSS REFERENCE TO RELATED APPLICATION

This application is based on Japanese Patent Application No. 2005-177762 filed on Jun. 17, 2005, the disclosure of which is incorporated herein by reference.

FIELD OF THE INVENTION

The present invention relates to a semiconductor device and a method for manufacturing the same.

BACKGROUND OF THE INVENTION

In the related art, for example in U.S. Pat. No. 6,696,323, a semiconductor device has been proposed, in which trenches are formed in a semiconductor substrate, then impurity layers are grown in the epitaxial manner in the trenches, and then the impurity layers are used for a drift region, base region, source region, or the like, thereby a channel region is set not only in a surface of the semiconductor substrate but also in a depth direction of the trenches.

In such a semiconductor device, since the channel region can be set also in the depth direction of the trenches, on-resistance can be made lower than a theoretical limit of standardized on-resistance in a semiconductor substrate in the related art. Specifically, decrease in on-resistance can be achieved compared with a vertical DMOS in the related art in low to medium withstand voltage, and for example, when depth of the trenches is set to be 30 μm, the on-resistance can be lower than the theoretical limit of the standardized on-resistance of the vertical DMOS in the related art in a region of withstand voltage of 300 V or lower.

For example, the semiconductor device can be considered to be in a layout in which a plurality of trenches are arrayed in a stripe pattern. Impurity layers are grown in the epitaxial manner within each of the plurality of trenches, thereby the drift region, base region, source region, or the like is formed.

However, it has been confirmed that thickness of the impurity layers that have been grown in the epitaxial manner is varied between a case that the layout of the trenches is used in a coarse pattern where a trench formation area is small in a chip, and a case that it is used in a fine pattern where the trench formation area is large in the chip.

Particularly, in the case of the coarse pattern, it was confirmed that variation occurred in thickness of the impurity layers even in an aggregate of the trenches (a group of trenches arrayed in a stripe pattern).

In this way, there is a difficulty that when the thickness of the source region is decreased, internal resistance of the source region is increased, and consequently on-resistance of the semiconductor device is increased.

SUMMARY OF THE INVENTION

In view of the above-described problem, it is an object of the present disclosure to provide a semiconductor device. It is another object of the present disclosure to provide a method for manufacturing a semiconductor device.

According to a first feature of an embodiment of the disclosure, a semiconductor device includes: a semiconductor substrate; an element region having a semiconductor element, which includes an impurity layer and a trench, wherein the impurity layer is disposed in the trench, wherein the impurity layer includes an epitaxial impurity layer, and wherein the trench is disposed on a main surface of the semiconductor substrate; and a field region disposed around the element region. The trench is an aggregation of a plurality of stripe line trenches so that the element region has a polygonal shape. The field region includes a dummy trench disposed on a periphery of the element region. The dummy trench is disposed along with at least one side of the polygonal shape on the periphery of the element region. The dummy trench has a width substantially equal to a width of the trench in the element region. The dummy trench has a longitudinal direction substantially equal to a longitudinal direction of the trench in the element region. The field region further includes an impurity layer disposed in the dummy trench. The impurity layer of the field region includes an epitaxial impurity layer.

In the above device, trenches for element formation are formed as an aggregate where a plurality of the trenches are arranged in a stripe pattern, thereby an element region is made to have a polygon shape; and in a field region, dummy trenches having the same width as the trenches for element formation and the same longitudinal direction as a longitudinal direction of the trenches for element formation are formed in a manner of running along at least one side of an outer edge of the element region in a site situated in the outer edge of the element region in the field region, and impurity layers are formed even in the dummy trenches.

In this way, when the dummy trenches having the same width as the trenches for element formation and the same longitudinal direction as the longitudinal direction of the trenches for element formation are formed in a manner of running along at least the one side of the outer edge of the element region in the site situated in the outer edge of the element region in the field region, even if thickness variation occurs in the impurity layers formed in a dummy trench, thickness variation in the impurity layers formed in trenches for element formation situated inside the relevant dummy trench can be reduced or eliminated. Thus, finished shapes of the impurity layers can be made uniform, and consequently characteristic of a semiconductor element can be made uniform. The semiconductor device can suppress variation in thickness of the impurity layers formed in the trenches.

According to a second feature of the embodiment of the disclosure, a method for manufacturing a semiconductor device includes the steps of: preparing a semiconductor wafer having a plurality of chips and a scribe region thereon, wherein the chips is to be separated by the scribe region into individual chips, wherein each chip includes a element region and a field region disposed around the element region; forming a trench in the element region in such a manner that the trench is formed to be an aggregation of a plurality of stripe line trenches so that the element region has a polygonal shape; forming a dummy trench in the field region in such a manner that the dummy trench is disposed along with at least one side of the polygonal shape of the trench on a periphery of the element region, wherein the dummy trench in the field region has a width substantially equal to a width of the trench in the element region, wherein the dummy trench has a longitudinal direction substantially equal to a longitudinal direction of the trench in the element region, and wherein the step of forming the trench in the element region and the step of forming the dummy trench in the field region are performed simultaneously; and forming an impurity layer in the trench in the element region and in the dummy trench in the field region by an epitaxial growth method.

Specifically, in the above method, a step of preparing a semiconductor wafer; a step of forming the trenches for element formation as an aggregate in which a plurality of the trenches are arranged in a stripe pattern in an element region to be made into a chip in the semiconductor wafer, thereby configuring the element region in a polygonal shape, and concurrently with this, forming the dummy trenches having the same width as the trenches for element formation and the same longitudinal direction as a longitudinal direction of the trenches for element formation in a manner of running along at least one side of an outer edge of the element region in a field region to be made into the chip; and a step of forming the impurity layers using epitaxial growth in the trenches for element formation and the dummy trenches are included.

In this way, the trenches for element formation and the dummy trenches can be formed at the same time, and the impurity layers can be formed at the same time in them. The impurity layers are formed also in the dummy trenches in this way, thereby even if thickness variation occurs in the impurity layers formed in a dummy trench, thickness variation in impurity layers formed in trenches for element formation situated inside the relevant dummy trench can be reduced or eliminated. Thus, the finished shapes of the impurity layers can be made uniform, and consequently the characteristic of the semiconductor element can be made uniform.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventors have preliminarily studied about a semiconductor device as a comparison of embodiments of the present invention.

Figure 19A:
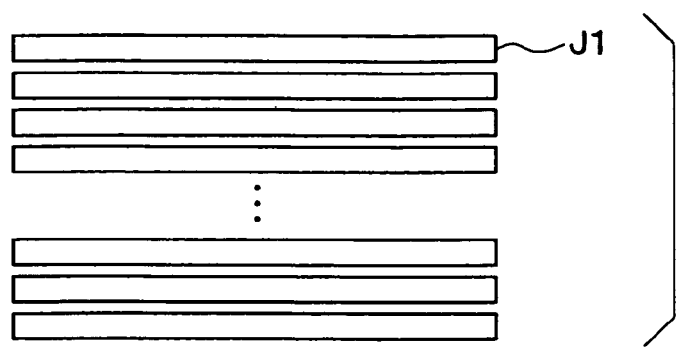
FIG. 19A is a plan view showing a trench arranged to be a stripe pattern according to a comparison of the first embodiment of the present invention.

For example, as shown in FIG. 19A, the semiconductor device as the comparison can be considered to be in a layout in which a plurality of trenches J1 are arrayed in a stripe pattern. Impurity layers are grown in the epitaxial manner within each of the plurality of trenches J1, thereby the drift region, base region, source region, or the like is formed.

Figure 19B:
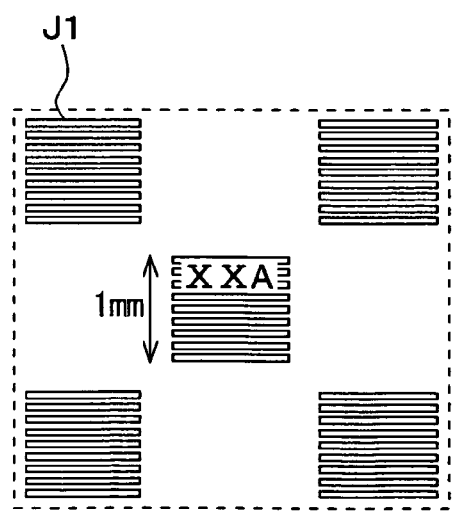
FIG. 19B is a plan view showing a coarse pattern of the trench in the device.
Figure 19C:
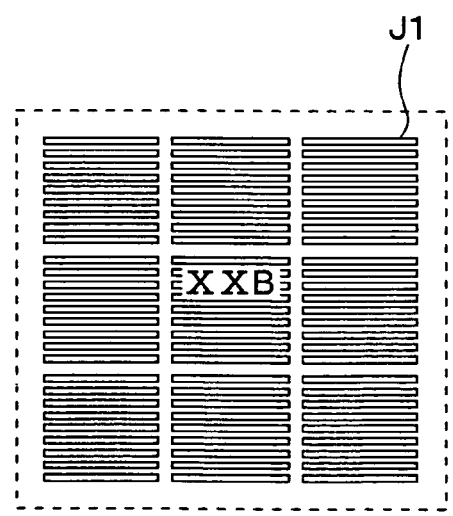
FIG. 19C is a plan view showing a fine pattern of the trench in the device.

However, it has been confirmed that thickness of the impurity layers that have been grown in the epitaxial manner is varied between a case that the layout of the trenches J1 shown in FIG. 19A is used in a coarse pattern where a trench formation area is small in a chip as shown in FIG. 19B, and a case that it is used in a fine patter where the trench formation area is large in the chip as shown in FIG. 19C.

Figure 20A:
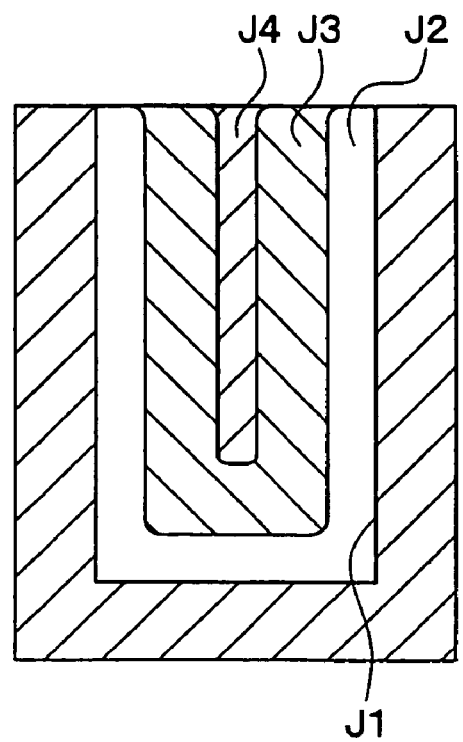
FIG. 20A is a cross sectional view showing a part of the device at a point XXA in FIG. 19B.
Figure 20B:
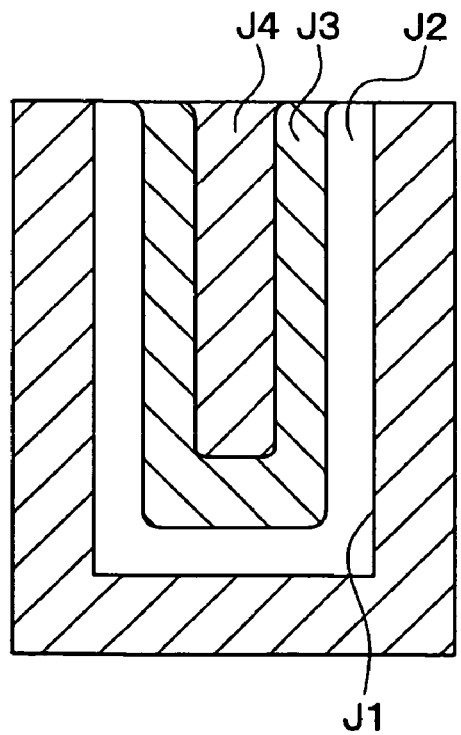
FIG. 20B is a cross sectional view showing a part of the device at a point XXB in FIG. 19C.

For example, in the case that an $n^-$-type drift region J2, a p-type base region J3, and an $n^+$-type source region J4 are formed in the trench J1 at a position of a point XXA in the coarse pattern shown in FIG. 19B and a position of a point XXB in the fine pattern shown in FIG. 19C, when cross sectional views are shown, FIG. 20A and FIG. 20B are given respectively.

As known from the views, in the case of the coarse pattern, a growth rate of the impurity layers is high compared with the case of the fine pattern. It is known that since epitaxial growth occurs in order of the $n^-$-type drift region, p-type base region, and $n^+$-type source region are grown in the epitaxial manner in this order in the trench, thickness of the $n^-$-type drift region J2 and the p-type base region J3 is large in the case of FIG. 20A of the coarse pattern in which the growth rate is high compared with the case of FIG. 20B of the fine pattern in which the growth rate is low.

Figure 21A:
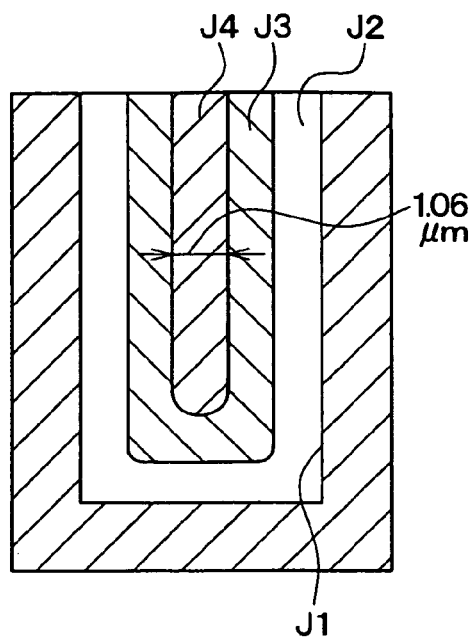
FIGS. 21A to 21C are cross sectional views showing a center portion, an intermediate portion and a periphery portion of a trench having a coarse pattern, according to the comparison of the first embodiment.
Figure 21B:
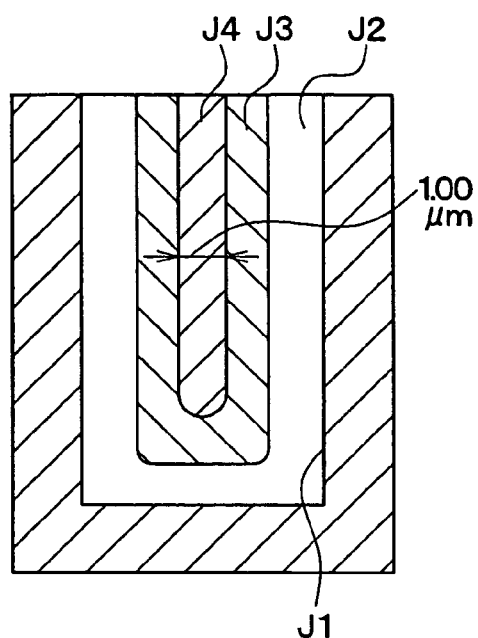
Figure 21C:
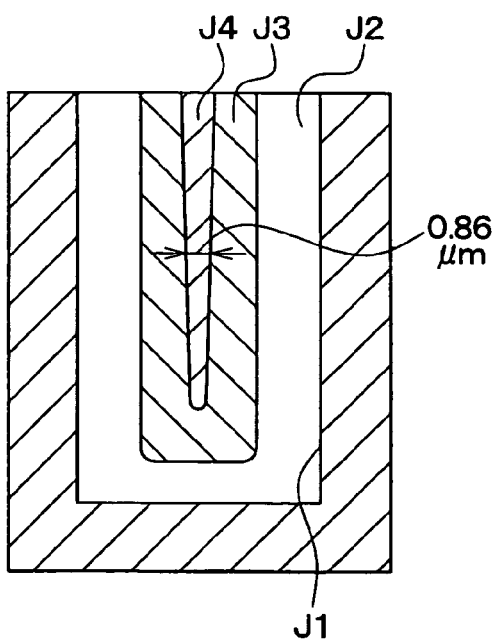
Figure 22A:
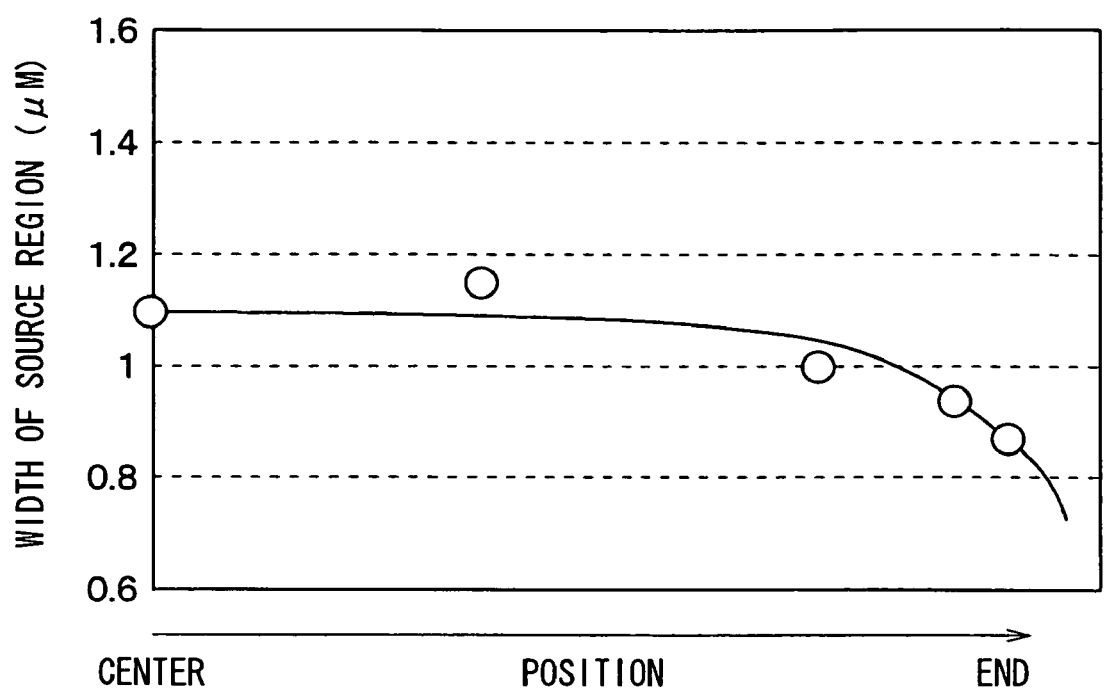
FIG. 22A is a graph showing a relationship between a position in the device and a width of a source region, according to the comparison of the first embodiment.

Particularly, in the case of the coarse pattern, it was confirmed that variation occurred in thickness of the impurity layers even in an aggregate of the trenches (a group of trenches arrayed in a stripe pattern). FIGS. 21A to 21C show section SEM images on results of investigating shapes of the n$^-$-type drift region J2, p-type base region J3, and n$^+$-type source region J4 formed in the trench J1 and thickness of the n$^+$-type source region J4 at three places of a central position of the trench aggregate, an intermediate position between the central position and an end, and the end. FIG. 22 shows a result of investigation on variation in thickness of the n$^+$-type source region J4 from the central position to the end of the aggregate of the trenches J1. The thickness, i.e., the width of the source region J4 is measured at a depth of 10 μm.

As shown in the figures, thickness of the n$^+$-type source region J4 is 1.06 μm at the central position of the aggregate of the trenches, 1.00 μm at the intermediate position from the central position to the end, and 0.84 μm at the end. Thus, while the n$^+$-type source region J4 is somewhat thick at the central position of the aggregate of the trenches J1, it is thin at the end. It is known from this that the n$^+$-type source region is thin in the end of the pattern, and conversely the n$^-$-type drift region and the p-type base region are thick and therefore high in growth rate. Regarding the number of trench in the aggregate of the trenches J1 from the end until which thickness of the n$^+$-type source region J4 is reduced, while it varies depending on trench width or thickness of each of the impurity layers, it was known that thickness was reduced at least in the n$^+$-type source region J4 formed in the trench J1 situated in the outermost end.

In this way, there is a difficulty that when the thickness of the n$^+$-type source region J4 is decreased, internal resistance of the n$^+$-type source region J4 is increased, and consequently on-resistance of the semiconductor device is increased.

First Embodiment

Figure 1:
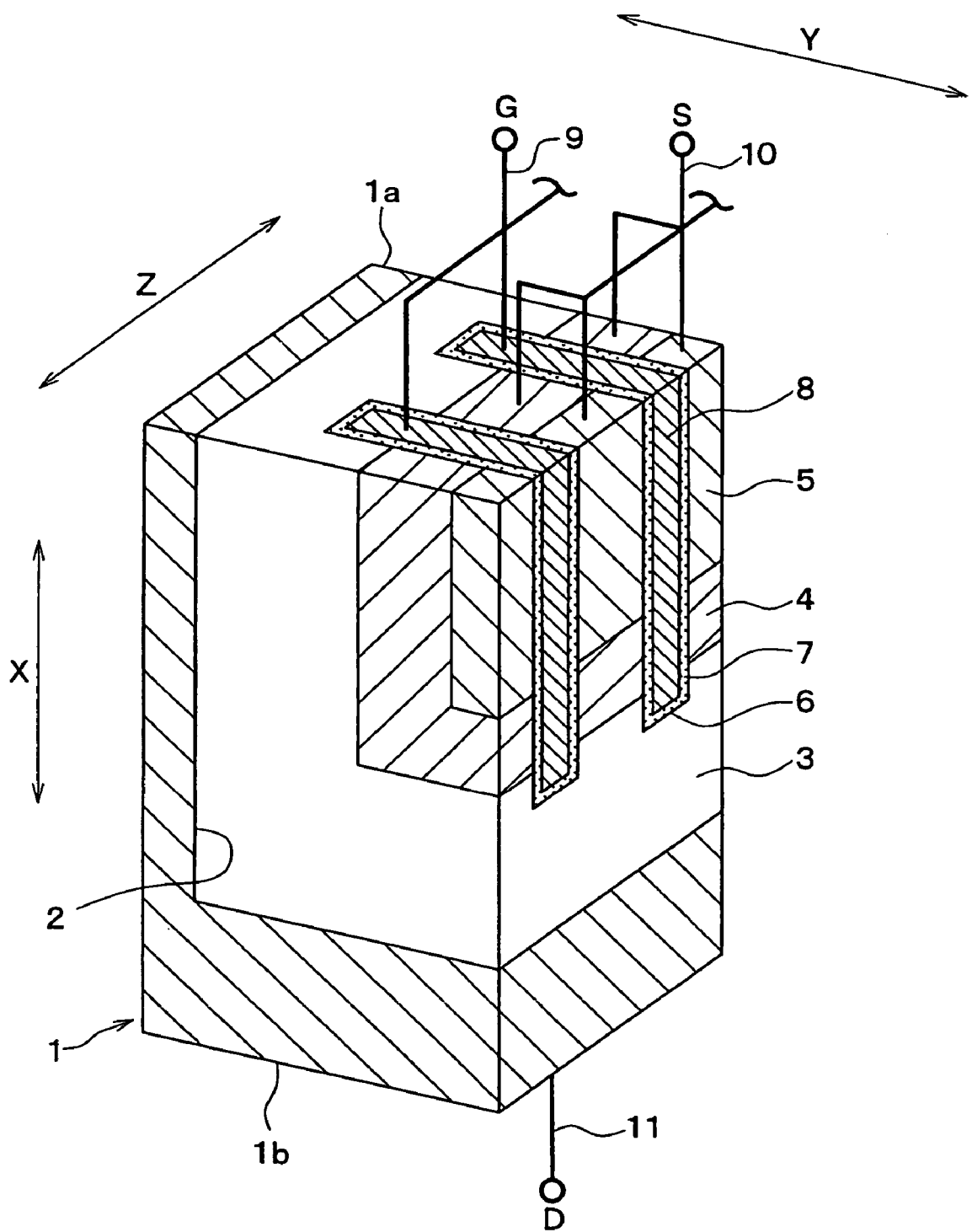
FIG. 1 is a perspective view showing a main part of a MOSFET in a semiconductor device according to a first embodiment of the present invention.

In view of the above difficulty, a first embodiment of the invention is described. In the embodiment, an embodiment of the invention is applied to a semiconductor device having a power MOSFET. FIG. 1 is a perspective section view of a major part of the power MOSFET provided in the semiconductor device. Hereinafter, a configuration of the power MOSFET is described according to the figure.

In the power MOSFET of the embodiment, an n$^+$-type substrate 1 having a main surface 1a and a back face 1b as an opposite surface to the main surface 1a is used. An X direction shown by an arrow in the figure corresponds to a thickness direction of the n$^+$-type substrate 1 (direction perpendicular to the main surface 1a and the back face 1b), and a Y direction and a Z direction shown by other arrows in the figure correspond to a direction parallel to the main surface 1a and the back face 1b of the n$^+$-type substrate 1. The X, Y and Z directions in the figure are perpendicular to one another.

A trench 2 is formed from the main surface 1a of the n$^+$-type substrate 1 to a predetermined depth. In the trench 2, an n$^-$-type drift region 3, p-type base region 4 and n$^+$-type source region 5 are stacked in this order as impurity layers.

Depth of the n$^-$-type drift region 3 is made to be about 1 to 100 μm. Phosphorous or arsenic is used for an impurity for formation of the n$^-$-type drift region 3, and a concentration of the impurity is about $1\times10^{14}$ to $1\times10^{16}$ cm$^{-3}$. The impurity concentration of the n$^-$-type drift region 3 is approximately uniform in both of a depth direction (X direction) and a width direction (Y direction).

Depth of the p-type base region 4 is made to be about 1 to 100 μm, however, it is slightly shallow compared with the n$^-$-type drift region 3. Boron is used for an impurity for formation of the p-type base region 4, and a concentration of the impurity is about $1\times10^{14}$ to $1\times10^{19}$ cm$^{-3}$. The impurity concentration of the p-type base region 4 is approximately uniform in both of the depth direction (X direction) and the width direction (Y direction).

Depth of the n$^+$-type source region 5 is made to be about 1 to 100 μm, however, it is slightly shallow compared with the p-type base region 4. Phosphorous or arsenic is used for an impurity for formation of the n$^+$-type source region 5, and a concentration of the impurity is about $1\times10^{18}$ to $1\times10^{20}$ cm$^{-3}$. The impurity concentration of the n$^+$-type source region 5 is approximately uniform in both of the depth direction (X direction) and the width direction (Y direction).

A MOS gate trench 6 is formed perpendicularly from the main surface 1a of the n$^+$-type substrate 1, that is, approximately parallel to the X direction. The MOS gate trench 6 is formed such that it penetrates through the p-type base region 4 from the n$^+$-type source region 5 in both the directions of the Y direction parallel to the main surface 1a of the n$^+$-type substrate 1 and the X direction parallel to the depth direction of the MOS gate trench 6.

In a configuration of the power MOSFET, a gate oxide film 7 is formed on a surface of the MOS gate trench 6, and the inside of the MOS gate trench 6 is filled with a gate electrode 8 via the gate oxide film 7.

In such a configuration, a portion opposed to the p-type base region 4 in the n$^+$-type substrate 1 configures an n$^+$ drain region, and the n$^+$-type source region 5, p-type base region 4, n-type drift region 3, and n$^+$ drain region are arrayed in this order in the Y direction parallel to the main surface 1a of the n$^+$-type substrate 1, and such an array is formed to a depth approximately equal to the depth of the MOS gate trench 6 in the X direction perpendicular to the main surface 1a of the n$^+$-type substrate 1.

Depth of each of the p-type base region 4, n$^+$-type source region 5, and n$^-$-type drift region 3 is set correspondingly to the depth of the trench 2, and the depth is increased with increase in depth of the trench 2.

While not shown in FIG. 1, an interlayer insulating film 13 (refer to FIG. 5) such as oxide film is formed not only on a surface of the MOS gate trench 6 but also on the main surface 1a of the n$^+$-type substrate 1, and a gate wiring line 9 is patterned on the interlayer insulating film. Furthermore, while not shown in FIG. 1, similarly as the gate wiring line 9 patterned on the surface of the n$^+$-type substrate 1, a source electrode 10 is formed on the interlayer insulating film, and a drain electrode 11 is provided on the back face of the n$^+$-type substrate 1. Cells of the power MOSFET of the embodiment are configured in this manner, and a large number of the cells are provided, so that the power MOSFET is configured.

Figure 2A:
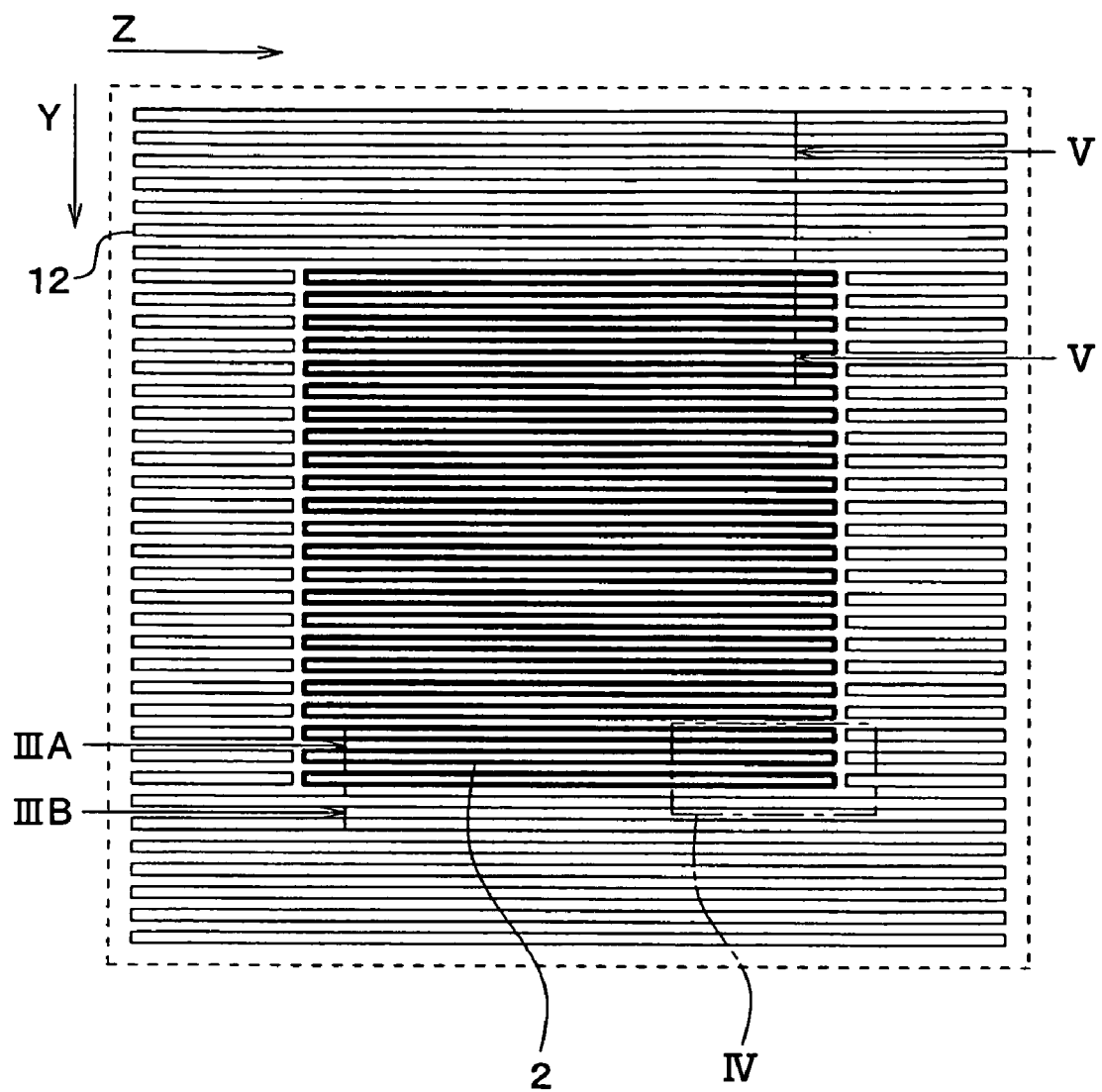
FIG. 2A is a plan view showing a trench and a dummy trench in the device according to the first embodiment.
Figure 2B:
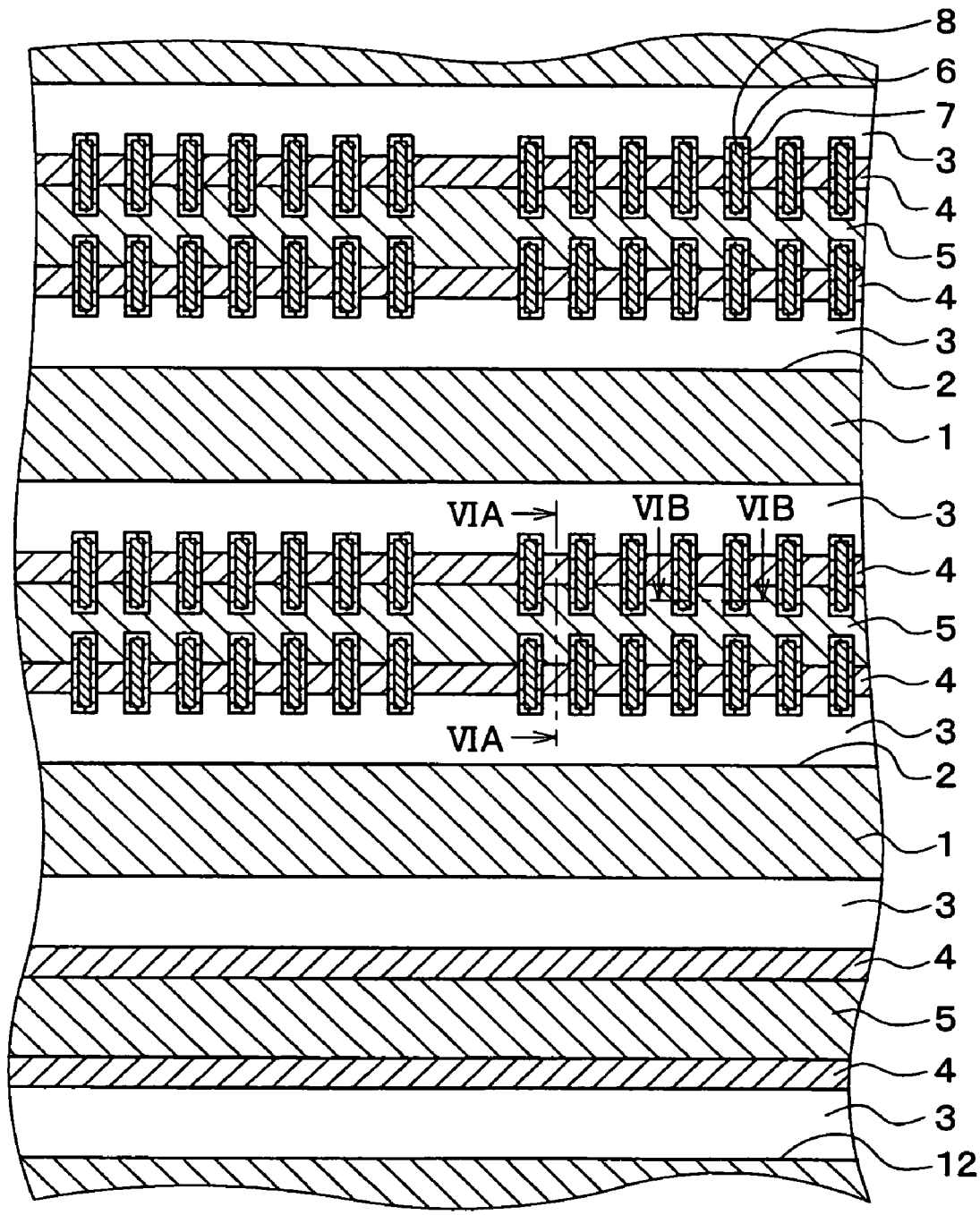
FIG. 2B is a partially enlarged plan view showing a region IV in FIG. 2A.

FIGS. 2A to 2B show layout of respective components when the semiconductor device having the power MOSFET shown in FIG. 1 is seen from a side of the main surface 1a of the n$^+$-type substrate 1. Specifically, FIG. 2A is a layout view showing only the trenches 2 of the semiconductor device in which the power MOSFET is formed and dummy trenches 12 described later, and FIG. 2B is a partially enlarged view of a region IIA shown by a chain line in FIG. 2A. A Y direction and a Z direction shown in FIG. 2A and FIG. 2B correspond to the Y direction and the Z direction in FIG. 1.

As shown in FIG. 2A, the semiconductor device is configured in a manner of being divided into chips one by one, and within the chip, the trenches 2 are in a condition where the Z direction is assumed as a longitudinal direction and the Y direction is assumed as an array direction, and a plurality of trenches are arrayed in a stripe pattern.

Figure 3:
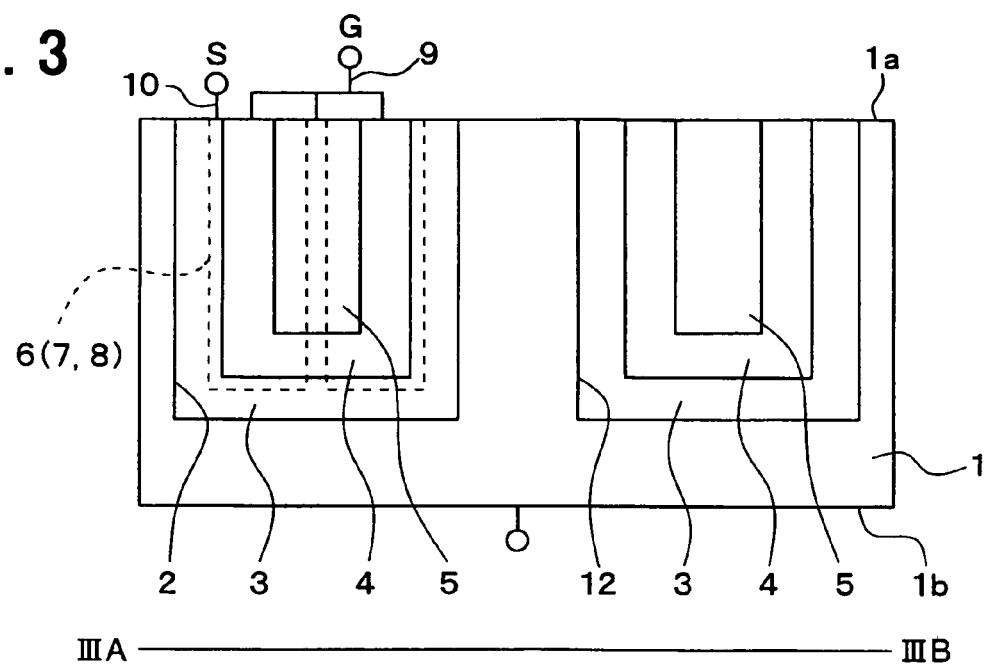
FIG. 3 is a cross sectional view showing a part of the device taken along line IIIA-IIIB in FIG. 2A.

In outer edge portions of the chip, the dummy trenches 12 are formed such that they enclose an outer circumference of an aggregate of the trenches 2 (that is, element region). While the dummy trenches 12 are configured in the same depth as the trenches 2, they act as a dummy. This is described with reference to FIG. 3. FIG. 3 is a cross, sectional view along a line IIIA-IIIB in FIG. 2A As shown in a broken line portion in FIG. 3, an area in which the trenches 2 are formed is made in a structure where the MOS gate trench 6 is formed from the main surface 1a, and the gate insulating film 7 and the gate electrode 8 are formed such that they fill the MOS gate trench 6. On the contrary, an area in which the dummy trenches 12 are formed is made in a structure where the MOS gate trench 6, the gate insulating film 7, and the gate electrode 8 are not formed. That is, while the dummy trenches 12 are used for forming the same impurity layers as in the power MOSFET, actually they are not used as the power MOSFET.

The dummy trenches 12 are set extendedly along a longitudinal direction of the trenches 2, and a plane direction in a longitudinal direction of the dummy trenches 12 and plane directions on both ends of the dummy trenches correspond to a plane direction in the longitudinal direction of the trenches 2 and plane directions on both ends of the trenches. For example, the longitudinal directions of the dummy trenches 12 and the trenches 2 are set such that opposed side faces of the dummy trenches 12 and the trenches 2 have a plane direction of (100), i.e., a (100) crystal plane, respectively.

While any optional number of the dummy trenches 12 can be used, in the embodiment, portions of the dummy trenches 12 situated on extension lines of the trenches 2, that is, dummy trenches situated in two lateral sides of the aggregate of the trenches 2 in FIG. 2A are made to be in the same number as that of the trenches 2, and dummy trenches situated in two vertical sides of the aggregate of the trenches 2 are made to be in the number of at least one.

Figure 4:
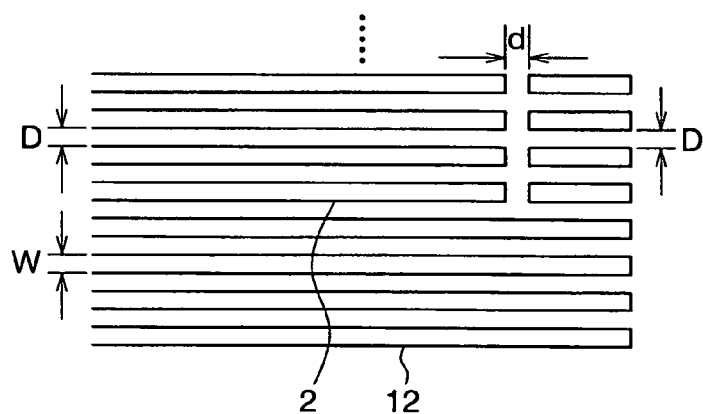
FIG. 4 is a partially enlarged plan view showing a region IV in FIG. 2.

Width of the dummy trench 12, an interval between the dummy trenches and the like are as follows. FIG. 4 is an enlarged view of a lower right portion IV of FIG. 2A, and description is made with reference to the figure.

The width of the dummy trench 12 is appropriately set depending on width of the trench 2 (that is, thickness of each of the impurity layers), and set to be the same as the width of the trench 2. In the embodiment, for example, when the width of the trench 2 is set to be W, the width of the dummy trench 12 is also set to be W.

The interval between the dummy trenches 12 is also made to match with an interval between the trenches 2, and in the embodiment, for example, the interval between the dummy trenches 12 is made to be D in order to be equal to the interval D between the trenches 2. While the interval between the dummy trenches 12 is preferably the same as the interval between the trenches 2, it need not be always the same.

Dummy trenches 12 situated on the extension lines on the trenches 2 in the dummy trenches 12 are configured to be separated from the aggregate of the trenches 2 by a predetermined interval d. For example, while the interval d is set to be 2 to 15 μm, it can be optionally adjusted, and the interval d may be set to be 0 so that the trenches 2 and the dummy trenches 12 are continuously formed.

Figure 5:
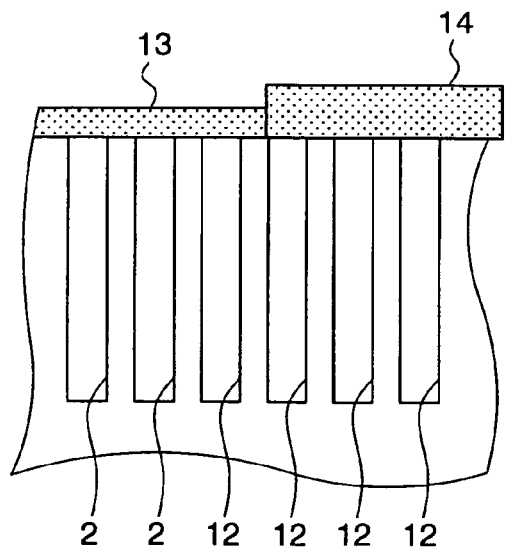
FIG. 5 is a cross sectional view showing a part of the device taken along line V-V in FIG. 2.

Furthermore, FIG. 5 is a cross section view along a line V-V in FIG. 2A. While each of the impurity layers in the trenches 2 and the dummy trenches 12 is not shown in FIG. 5, actually each of the impurity layers is provided.

As shown in the figure, while an interlayer insulating film 13 is formed on the aggregate of the trenches 2, an oxide film 14 thicker than the interlayer insulating film 13 is formed on the dummy trenches 12. Each of the impurity layers formed within the dummy trenches 12 is isolated by the oxide film 14 and thus in an electrical floating state. For example, while the p-type base region 4 formed in the trench 2 is clamped in voltage by being electrically connected to the source electrode 10, the p-type base region 4 formed in the dummy trench 12 is in the floating state.

Furthermore, the thick oxide film is formed on the dummy trenches 12, thereby when a wiring line and the like are placed on the oxide film, withstanding voltage between the wiring line and the substrate can be secured.

According to the above configuration, the semiconductor device of the embodiment is configured. Next, a manufacturing process of the semiconductor device of the embodiment is shown in FIGS. 6A to 6F, FIGS. 7A to 7F, and FIGS. 8A to 8D, and the manufacturing process of the semiconductor device of the embodiment is described according to the figures. In FIGS. 6A to 6F, FIGS. 7A to 7F, and FIGS. 8A to 8D, aspects of a cross section along a line VIA-VIA in FIG. 2B are shown in the left on paper, i.e., FIGS. 6A, 6C, 6E, 7A, 7C, 7E, 8A and 8C, and aspects of a cross section along a line VIB-VIB in FIG. 2B are shown in the right on paper, i.e., FIGS. 6B, 6D, 6F, 7B, 7D, 7F, 8B and 8D.

Figure 6A:
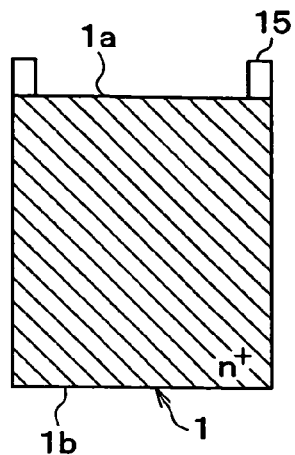
FIGS. 6A to 6F are partially cross sectional views explaining a method for manufacturing the device according to the first embodiment.
Figure 6B:
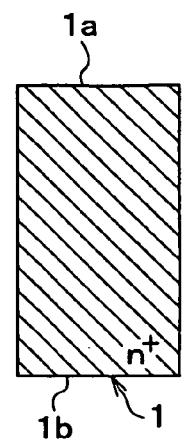

(Step Shown in FIGS. 6A and 6B)

First, an $n^+$-type substrate 1 is prepared. Then, a silicon oxide film 15 is formed on the $n^+$-type substrate 1 by a thermal oxidation method, a CVD method, or the like. Then, regions of the silicon oxide film 15 in which the trenches 2 and the dummy trenches 12 are to be formed are opened by etching in a photolithography step. At that time, width of an opening in a direction of the section along the line VIA-VIA in FIG. 6A is made to be corresponding to the width W of the trenches 2 and the dummy trenches 12.

Figure 6C:
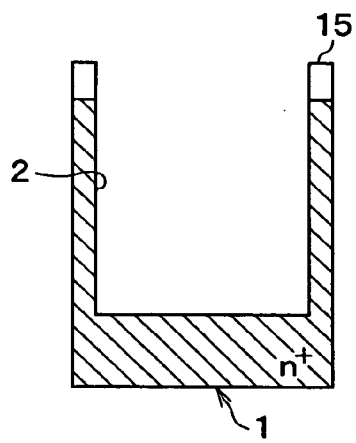
Figure 6D:
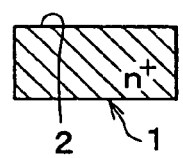

(Step Shown in FIGS. 6C and 6D)

Next, for example, trench etching 10 to 100 μm in depth is performed using the silicon oxide film 15 as a mask. Thus, regions of the $n^+$-type substrate 1 other than regions that will become the drain regions are removed, and consequently the trenches 2 and the dummy trenches 12 are formed. The trench etching at that time may be dry etching or wet etching.

Figure 6E:
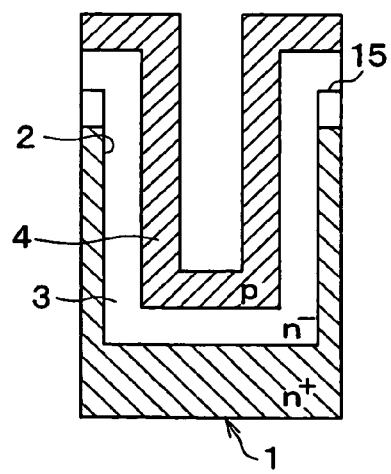
Figure 6F:
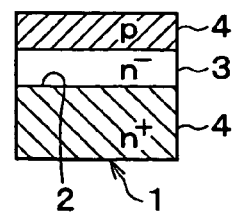

(Step Shown in FIGS. 6E and 6F)

Next, the $n^-$-type drift regions 3 are deposited on inner wall surfaces of the trenches 2 and the dummy trenches 12. At that time, since the $n^-$-type drift regions 3 are formed, for example, by epitaxial growth, the $n^-$-type drift regions 3 are formed in approximately even thickness and approximately even concentration distribution. Furthermore, the p-type base regions 4 are deposited such that they cover the $n^-$-type drift regions 3. Since the p-type base regions 4 are similarly formed, for example, by epitaxial growth, the p-type base regions 4 are formed in approximately even thickness and approximately even concentration distribution.

Figure 7A:
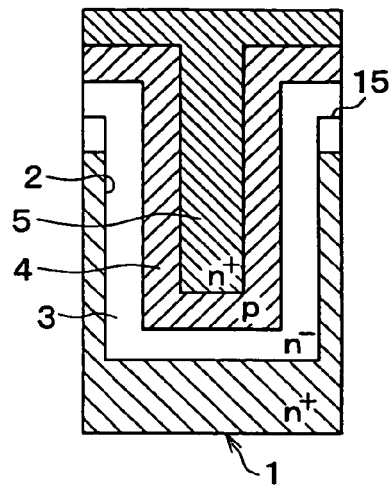
FIGS. 7A to 7F are partially cross sectional views explaining the method for manufacturing the device according to the first embodiment.
Figure 7B:
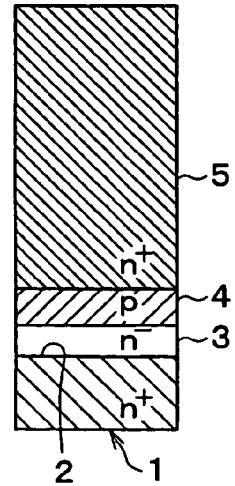

(Step Shown in FIGS. 7A and 7B)

Next, the $n^+$-type source regions 5 are deposited such that they cover the p-type base regions 4, and completely fill the trenches 2 and the dummy trenches 12. Since the $n^+$-type source regions 5 are similarly formed, for example, by epitaxial growth, the $n^+$-type source regions 5 are formed in approximately even thickness and approximately even concentration distribution. At that time, the $n^+$-type source regions 5 may be formed by depositing a polysilicon film doped with an n-type impurity.

In this way, since the n-type drift regions 3, p-type base regions 4, and n$^+$-type source regions 5 having approximately even thickness and approximately even concentration distribution are formed, positional relationships among them are determined in a self-aligning manner.

Figure 7C:
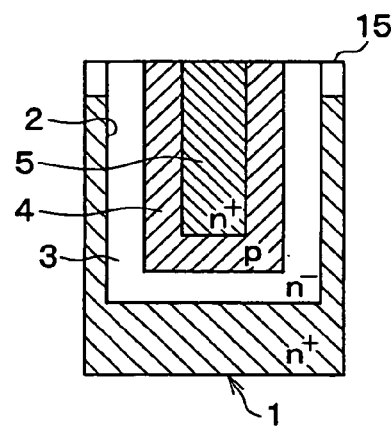
Figure 7D:
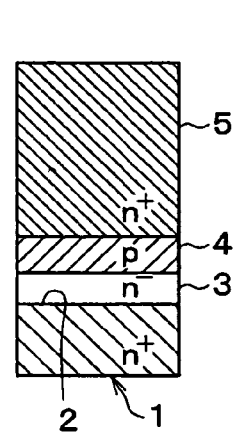

(Step Shown in FIGS. 7C and 7D)

Polishing for planarization is performed from a side of a substrate surface, and the n$^+$-type source regions 5, p-type base regions 4, and n-type drift regions 3 are planarized, for example, using the silicon oxide film 15 as an etching stopper.

Figure 7E:
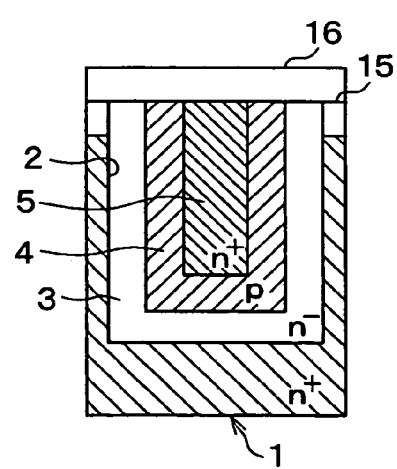
Figure 7F:
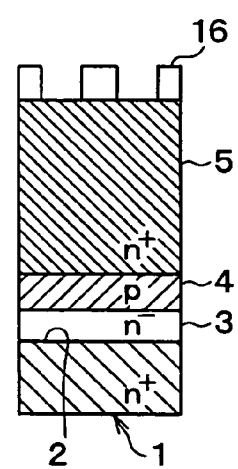

(Step Shown in FIGS. 7E and 7F)

Next, a silicon oxide film 16 is formed on the entire surface of the substrate by the CVD method and the like. Then, the silicon oxide film 16 is opened in regions where the MOS gate trenches 6 are to be formed in a photolithography step.

Figure 8A:
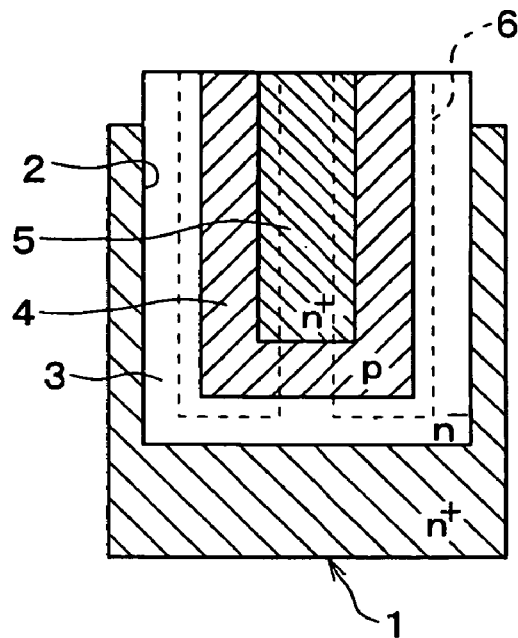
FIGS. 8A to 8D are partially cross sectional views explaining the method for manufacturing the device according to the first embodiment.
Figure 8B:
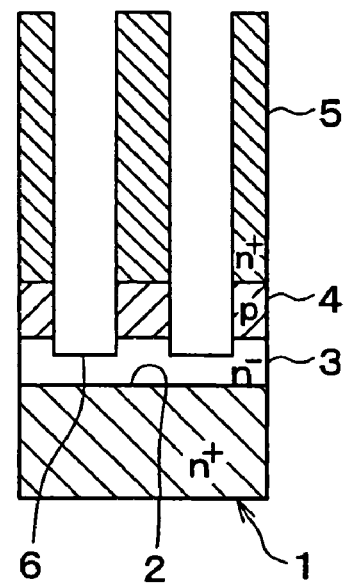

(Step Shown in FIGS. 8A and 8B)

Trench etching 10 to 100 µm in depth is performed using the silicon oxide film 16 and the silicon oxide film 15 as masks. The trench etching at that time may be the dry etching or the wet etching. Thus, the MOS gate trenches 6 are formed, which penetrate from the n$^+$-type source regions 5 to the drift regions 3 through the p-type base regions 4. Then, the silicon oxide film 16 and the silicon oxide film 15 are removed.

Figure 8C:
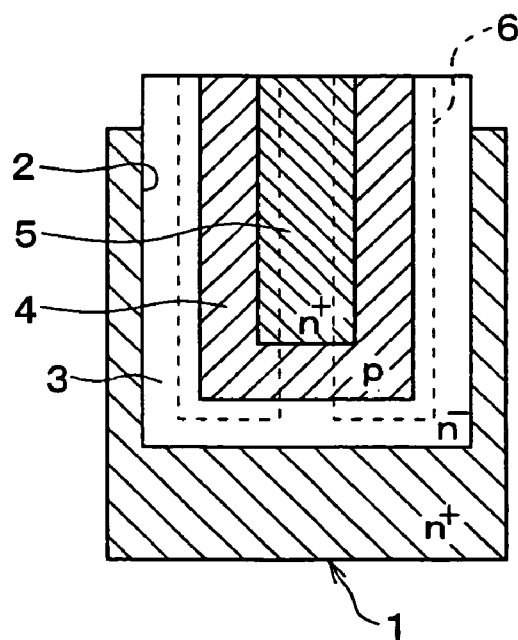
Figure 8D:
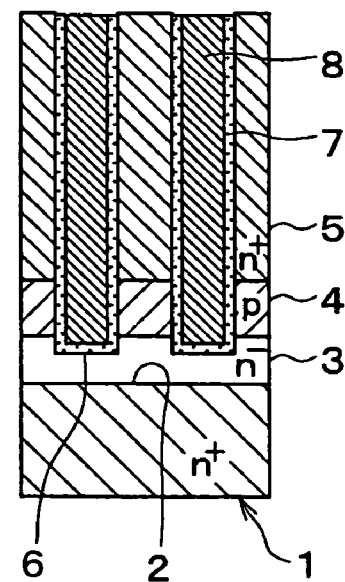

(Step Shown in FIGS. 8C and 8D)

Then, the gate oxide films 7 are formed on inner walls of the MOS gate trenches 6 by gate oxidation. Furthermore, the gate electrodes 8 are formed by filling the insides of the gate oxide films 7 with n$^+$-type polysilicon.

In the n$^+$-type polysilicon filling step, the insides of the MOS gate trenches 6 need to be completely filled, therefore the n$^+$-type polysilicon needs to be deposited in slightly large thickness. Therefore, the n$^+$-type polysilicon is subsequently subjected to etching back treatment, so that portions of the n$^+$-type polysilicon deposited above the substrate surface are reduced in thickness.

Then, the n$^+$-type polysilicon having reduced thickness is subjected to a photolithography step to cover necessary portions with a photoresist, and then the n$^+$-type polysilicon is patterned by dry or wet etching. Thus, wiring layers (not shown) to be connected to a plurality of gate electrodes 8 respectively are formed, and the gate electrodes 8 are formed at a level even with the substrate surface or at a level slightly depressed from the substrate surface.

Finally, while not shown, source electrodes 10 connected to the n$^+$-type source regions 5 and the p-type base regions 4 are formed on a side of a substrate surface 1a, and drain electrodes 11 connected to a back face 1b of the n$^+$-type substrate 1 as an n$^+$-type silicon substrate that is the n$^+$-type drain region are formed on a side of a substrate back face by a known method, and the gate wiring lines 9 for achieving electrical conduction to the gate electrodes 8 are patterned, in addition, the side of the substrate surface 1a is covered by a protective film, thereby the semiconductor device having the power MOSFET of the embodiment is completed.

According to the semiconductor device described hereinbefore, the following advantages can be obtained.

First, in the semiconductor device of the embodiment, the dummy trenches 12 are formed in a manner of enclosing the outer circumference of the trenches 2 where the power MOSFET is configured, and the n-type drift regions 3, p-type base regions 4, and n$^+$-type source regions 5 are formed also in the dummy trenches 12. Therefore, even if thickness variation occurs in the n-type drift regions 3, p-type base regions 4, and n$^+$-type source regions 5 formed in the dummy trenches 12, the thickness variation can be reduced or eliminated in the trenches 2 where the power MOSFETs are configured.

In this way, finished shapes of the n-type drift regions 3, p-type base regions 4, and n$^+$-type source regions 5 formed in the trenches 2 can be made uniform, and consequently a power MOSFET having a desired characteristic can be obtained, and increase in on-resistance of the semiconductor device can be prevented.

While the trenches 2 and the dummy trenches 12 are formed over a wide area in the chip configuring the semiconductor device, that is, while they are formed to be in a fine pattern here, the trenches 2 and the dummy trenches 12 may be formed only in a narrow area in the chip, that is, they may be formed to be in a coarse pattern. That is, when they are formed to be in the coarse pattern, the thickness variation tends to occur in an outer circumferential position of the aggregate of the trenches 2, however, the dummy trenches 12 are formed in a region of the position, thereby thickness variation in each of the impurity layers within the trenches 2 which act as power MOSFETs, can be suppressed even in the case of the coarse pattern.

Moreover, in the embodiment, each of the impurity layers formed in the dummy trenches 12 is made to be in the electrical floating state. Therefore, occurrence of leakage current through each of the impurity layers formed in the dummy trenches 12 or influence of electric noise and the like occurring when momentary voltage is externally applied can be prevented.

As a reference, in the related art, JP-A-10-223766 discloses a device using trench capacity as memory capacity. In this patent publication, dummy trench capacity is formed to prevent a loading effect (a phenomenon that trench depth varies depending on a fineness level of a pattern) in trench formation. When the trench is subjected to dry etching, an etching rate depends on the supply quantity of an etching gas, and as the dummy trench capacity to be formed, a trench having the same width and the same length as an actual memory trench capacity is typically formed in order to make the supply quantity of the etching gas to be constant.

On the contrary, in the case of the embodiment, each of the impurity layers is formed in the trenches 2 and the dummy trenches 12 by epitaxial growth, and a growth rate depends on not only the supply quantity of the deposition gas, but also the plane direction because the gas reacts on the surfaces of the inner wall faces of the trenches. Therefore, supply of the gas needs to be made uniform by making a deposition rate from the inner wall faces (particularly, side walls) constant. Therefore, the dummy trench 12, in which the impurity layers are grown in the epitaxial manner similarly as in the trench 2, also needs to be extendedly set in the same width, same plane direction, and same direction as the trench 2.

Second Embodiment

A second embodiment of the invention is described. In a semiconductor device of the embodiment, with respect to the first embodiment, only a layout of the trenches 2 and the dummy trenches 12 is different, and all other points are the same, therefore description is made only on different points.

Figure 9:
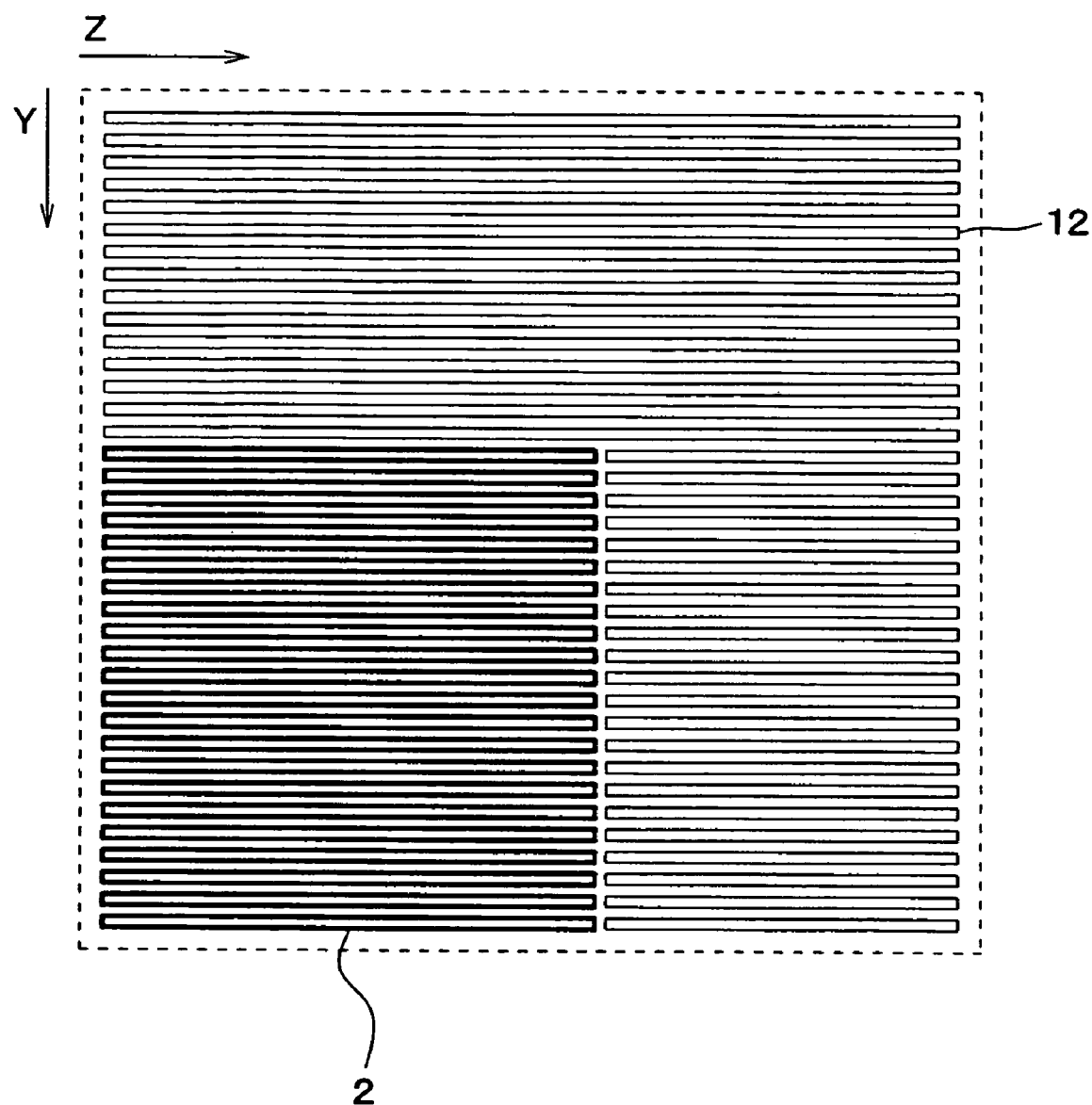
FIG. 9 is a plan view showing a trench and a dummy trench in a semiconductor device according to a second embodiment of the present invention.

FIG. 9 is a view showing the layout of the trenches 2 and the dummy trenches 12 when the semiconductor device of the embodiment is seen from the main surface 1a of the n$^+$-type substrate 1.

As shown in FIG. 9, the semiconductor device of the embodiment is made in such a form that the element region in which the aggregate of the trenches 2 are formed is not disposed in the center, that is, for example, in such a form that the aggregate of the trenches in which the power MOSFETs are configured is made close to one of four corners of a quadrangle.

In such a form, in other regions in the chip (field regions other than the element region), the dummy trench 12 are formed such that they are along and adjacent to at least one side of the aggregate of the trenches 2. Specifically, in the embodiment, the dummy trenches 12 are formed over a wide area of the other regions in the chip.

In this way, when the dummy trenches 12 are formed such that they are along and adjacent to at least one side of the aggregate of the trenches 2, they can be formed in a fine pattern, therefore the same advantages as in the first embodiment can be obtained. In particular, when such a form that the dummy trenches 12 are formed over the wide area of the other regions in the chip, so that the other regions are filled with the dummy trenches 12 is used as the embodiment, the same advantages as in the first embodiment can be obtained more effectively.

Third Embodiment

A third embodiment of the invention is described. Again in a semiconductor device of the embodiment, with respect to the first embodiment, only a layout of the trenches 2 and the dummy trenches 12 is different, and all other points are the same, therefore description is made only on different points.

Figure 10:
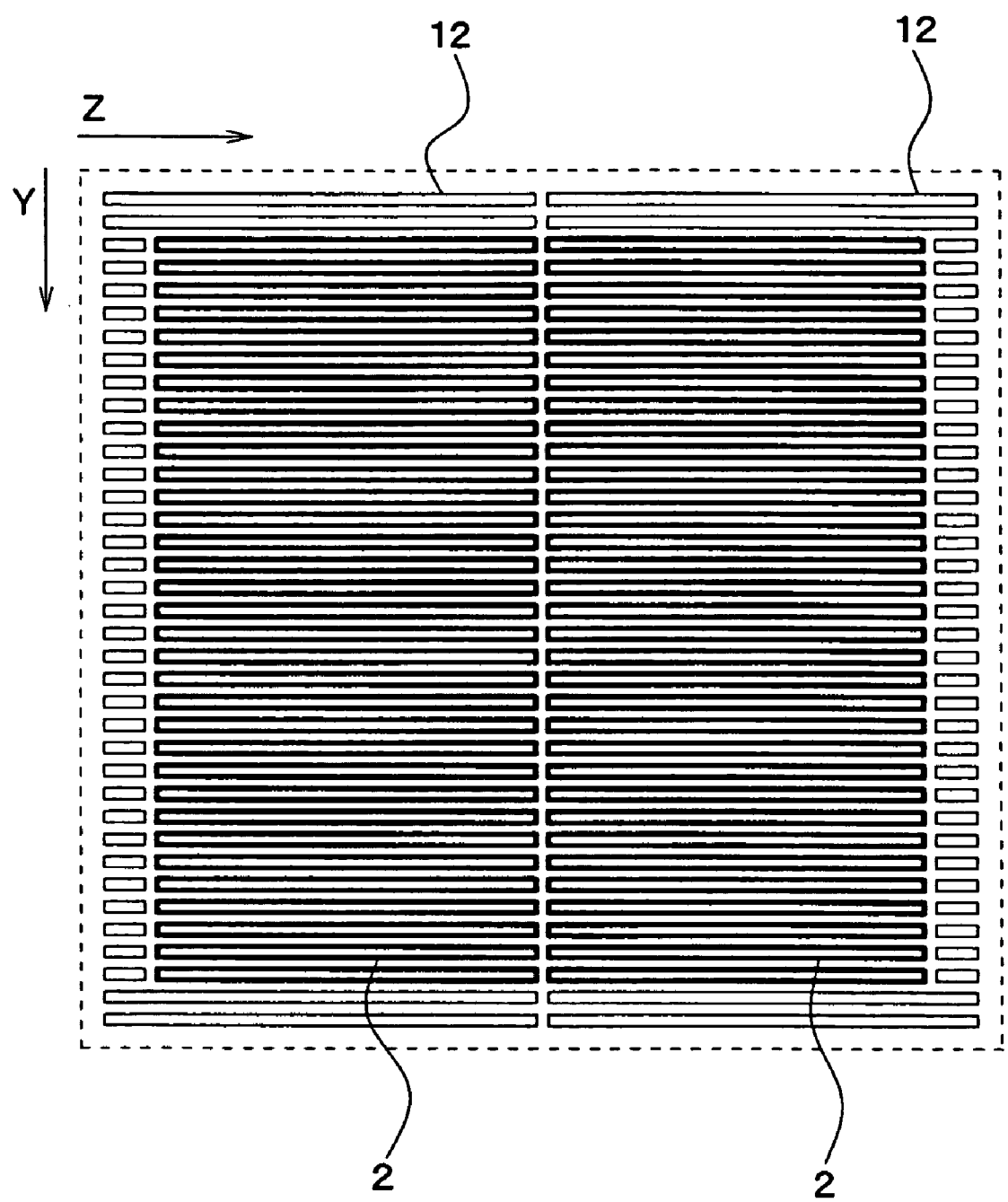
FIG. 10 is a plan view showing a trench and a dummy trench in a semiconductor device according to a third embodiment of the present invention.

FIG. 10 is a view showing the layout of the trenches 2 and the dummy trenches 12 when the semiconductor device of the embodiment is seen from the main surface 1a of the n+ substrate 1.

As shown in FIG. 10, the semiconductor device of the embodiment is made in such a form that when the element region in which the aggregate of the trenches 2 is formed is disposed in the center, the trenches 2 and the dummy trenches 12 are separated at an intermediate position in a longitudinal direction respectively. That is, length in the longitudinal direction of the trenches 2 and the dummy trenches 12 is made short compared with the first embodiment.

When the length in the longitudinal direction of the trenches 2 and the dummy trenches 12 is excessively long, sidewalls of the trenches 2 and the dummy trenches 12 may fall down. Therefore, the length in the longitudinal direction of the trenches 2 and the dummy trenches 12 is made short as the embodiment, thereby the sidewalls of the trenches 2 and the dummy trenches 12 can be prevented from falling down. Therefore, according to the semiconductor device of the embodiment, the same advantages as in the first embodiment are obtained, in addition, an advantage that the sidewalls of the trenches 2 and the dummy trenches 12 can be prevented from falling down can be obtained.

While such a form that the trenches 2 and the dummy trenches 12 were separated on a line bisecting the chip was shown as an example here, they may be separated at other places, or may be separated into any optional number of sections.

Fourth Embodiment

A fourth embodiment of the invention is described. In a semiconductor device of the embodiment, the third embodiment, in which the trenches 2 and the dummy trenches 12 are separated at an intermediate position in a longitudinal direction respectively, is combined with the second embodiment.

Figure 11:
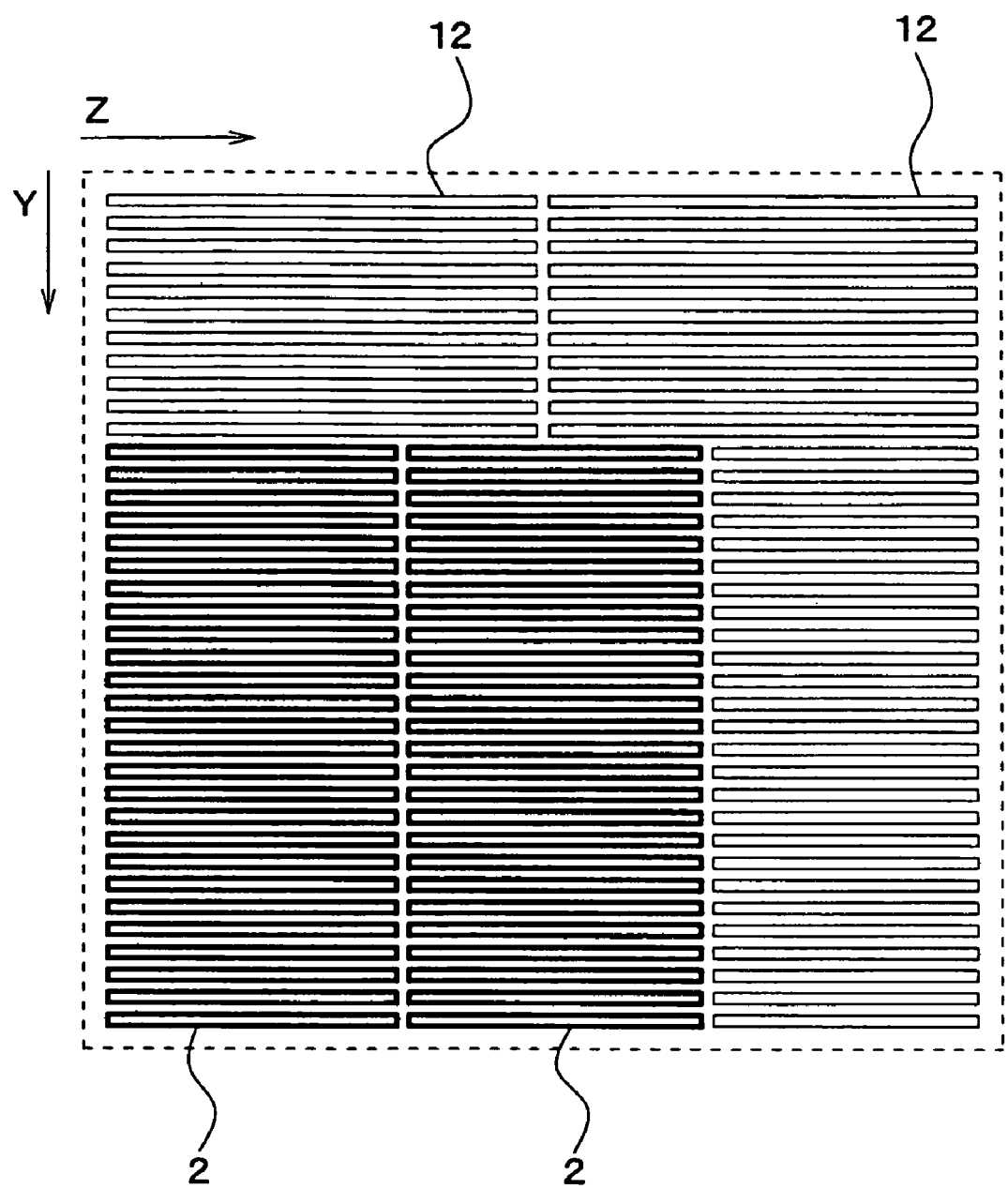
FIG. 11 is a plan view showing a trench and a dummy trench in a semiconductor device according to a fourth embodiment of the present invention.

FIG. 11 is a view showing a layout of the trenches 2 and the dummy trenches 12 when the semiconductor device of the embodiment is seen from the main surface 1a of the n+ substrate 1. As shown in the figure, even if the element region in which the aggregate of the trenches 2 is formed is not disposed in the center, the trenches 2 and the dummy trenches 12 can be separated at an intermediate position in the longitudinal direction respectively as shown in the third embodiment. Therefore, according to the semiconductor device of the embodiment, the same advantages as in the third embodiment can be obtained.

Fifth Embodiment

A fifth embodiment of the invention is described. In a semiconductor device of the embodiment, with respect to the fourth embodiment, when a shape of the element region in which the aggregate of the trenches 2 is formed is not a quadrangle, the element region is separated into several regions having different size.

Figure 12:
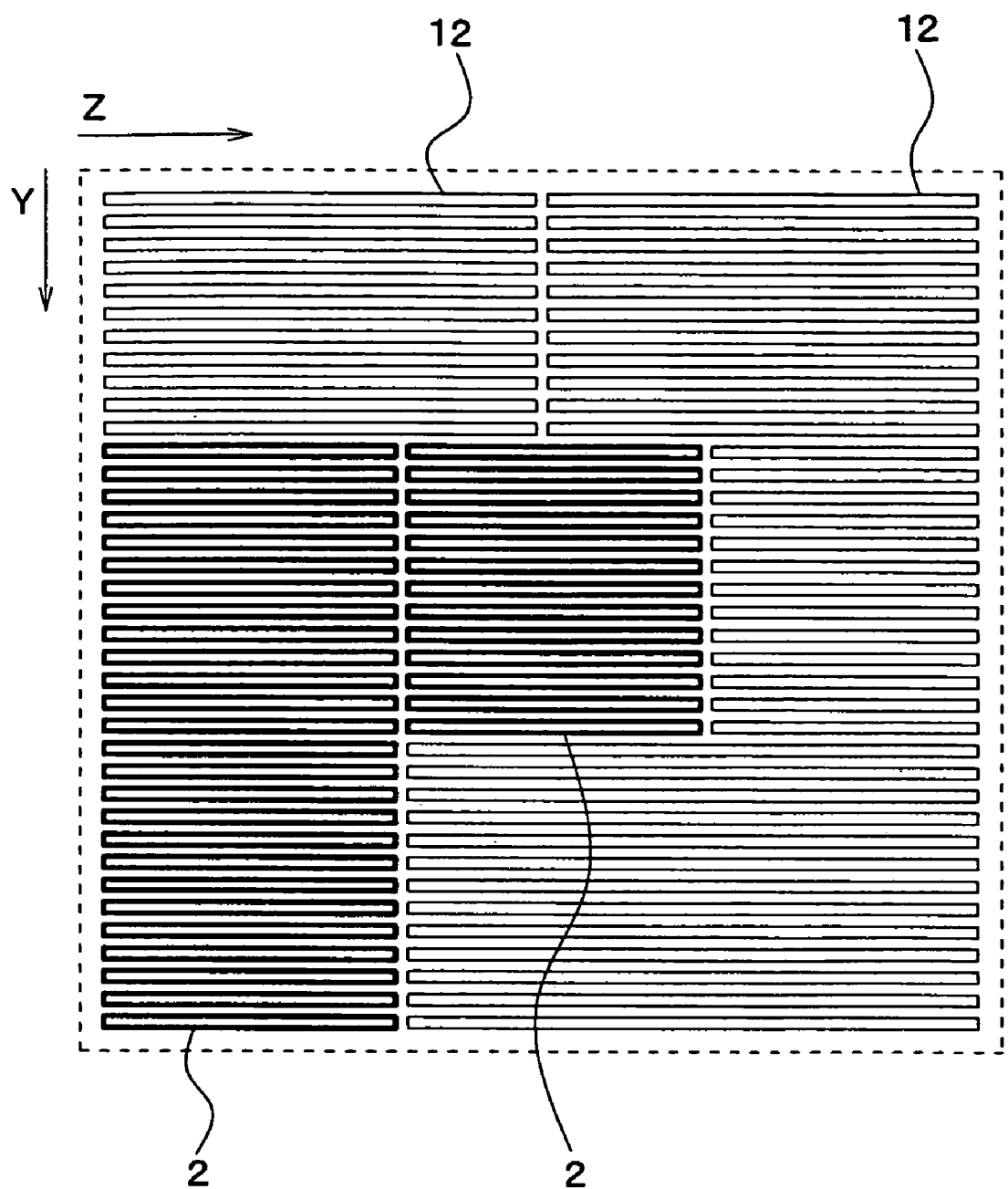
FIG. 12 is a plan view showing a trench and a dummy trench in a semiconductor device according to a fifth embodiment of the present invention.

FIG. 12 is a view showing a layout of the trenches 2 and the dummy trenches 12 when the semiconductor device of the embodiment is seen from the main surface 1a of the n+ substrate 1. As shown in the figure, the element region is configured by two quadrangle regions having different size, and the two regions are separated from each other.

In this way, even if each of the separated regions has different size, the same advantages as in the fourth embodiment can be obtained. While an example that the element region is separated into two regions is shown here, naturally, it may be separated into at least two regions.

Sixth Embodiment

A sixth embodiment of the invention is described. In a semiconductor device of the embodiment, with respect to the first embodiment, the element region in which the aggregate of the trenches 2 is formed is separated into several regions, and the outer circumference of each of the separated regions is enclosed by the dummy trenches 12.

Figure 13:
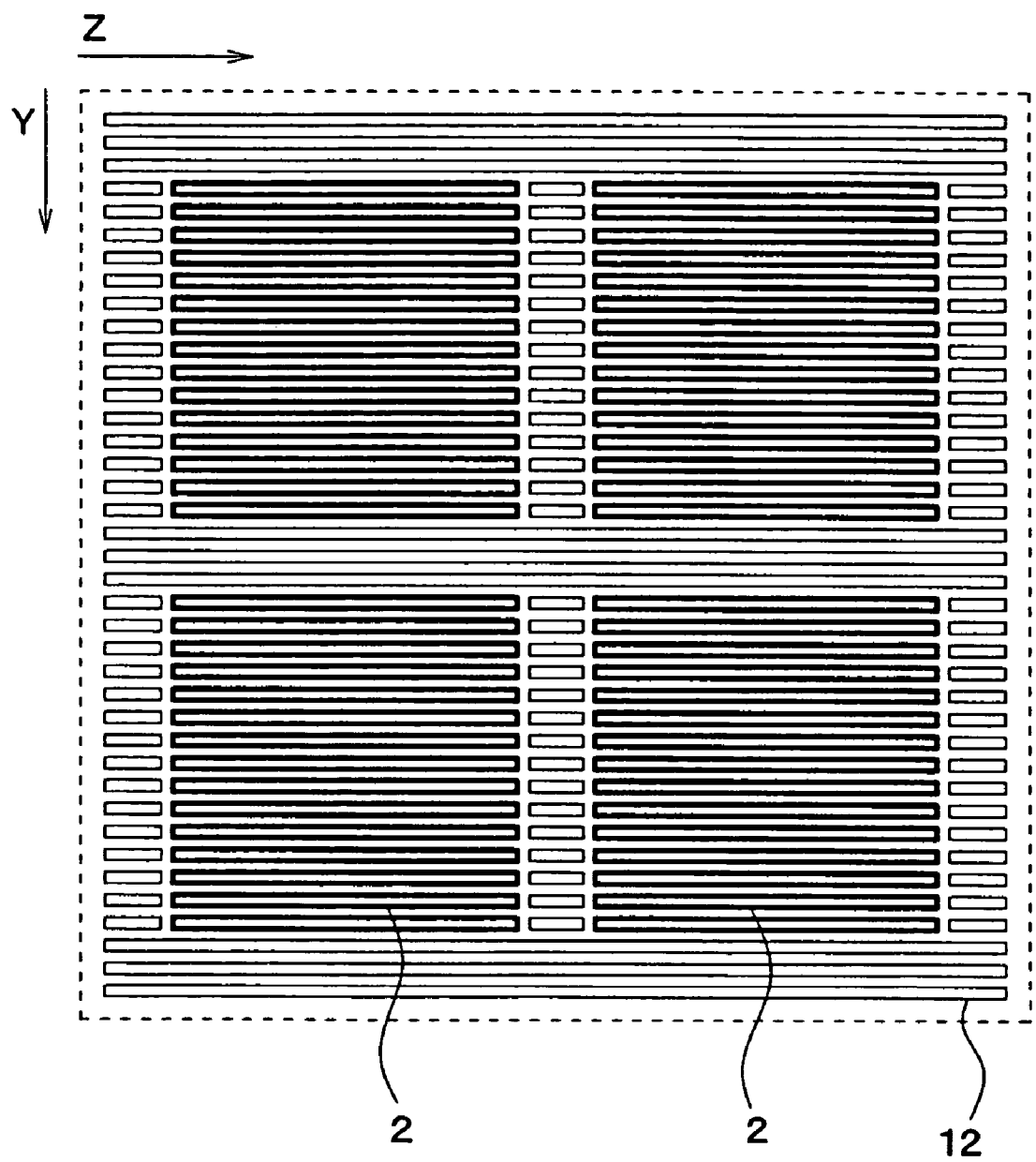
FIG. 13 is a plan view showing a trench and a dummy trench in a semiconductor device according to a sixth embodiment of the present invention.

FIG. 13 is a view showing a layout of the trenches 2 and the dummy trenches 12 when the semiconductor device of the embodiment is seen from the main surface 1a of the n+ substrate 1. As shown in the figure, the device has a structure where the element region is configured by regions of four quadrangles having the same size, and the regions are separated from each together, and the dummy trenches 12 are disposed also between the respective regions. At least one dummy trench 12 is formed between the respective regions, and thus the outer circumference of all the separated regions is enclosed by the dummy trenches 12.

In the embodiment, the four separated regions are in a symmetrical arrangement with a bisector parallel to the Y direction as the center, the bisector bisecting the chip. When a bisector parallel to the Z direction is used as the center, the four separated regions are similarly in a symmetrical arrangement. That is, the trenches 2 and the dummy trenches 12 in the semiconductor device of the embodiment are in a line-symmetric layout with two axes in the Y and Z directions as centers.

Again in this way, the same advantages as in the first and second embodiments can be obtained. Furthermore, in the case of the semiconductor device of the embodiment, since the line-symmetric layout with the bisector is used, when each of the impurity layers is deposited in the trench 2, uniform flow of the deposition gas is given, and consequently difference in growth rate can be reduced. Furthermore, since each of the separated regions is made to have the same size, further uniform flow of the deposition gas can be achieved, and consequently difference in growth rate can be further reduced.

Thus, thickness variation in each of the impurity layers can be eliminated as shown in the first embodiment, and for example, when power MOSFETs formed in the respective, separated regions are required to be used in a manner of being connected in parallel, characteristics of the power MOSFETs in the respective regions become uniform, and consequently deviation of current flow and the like can be eliminated.

Figure 14:
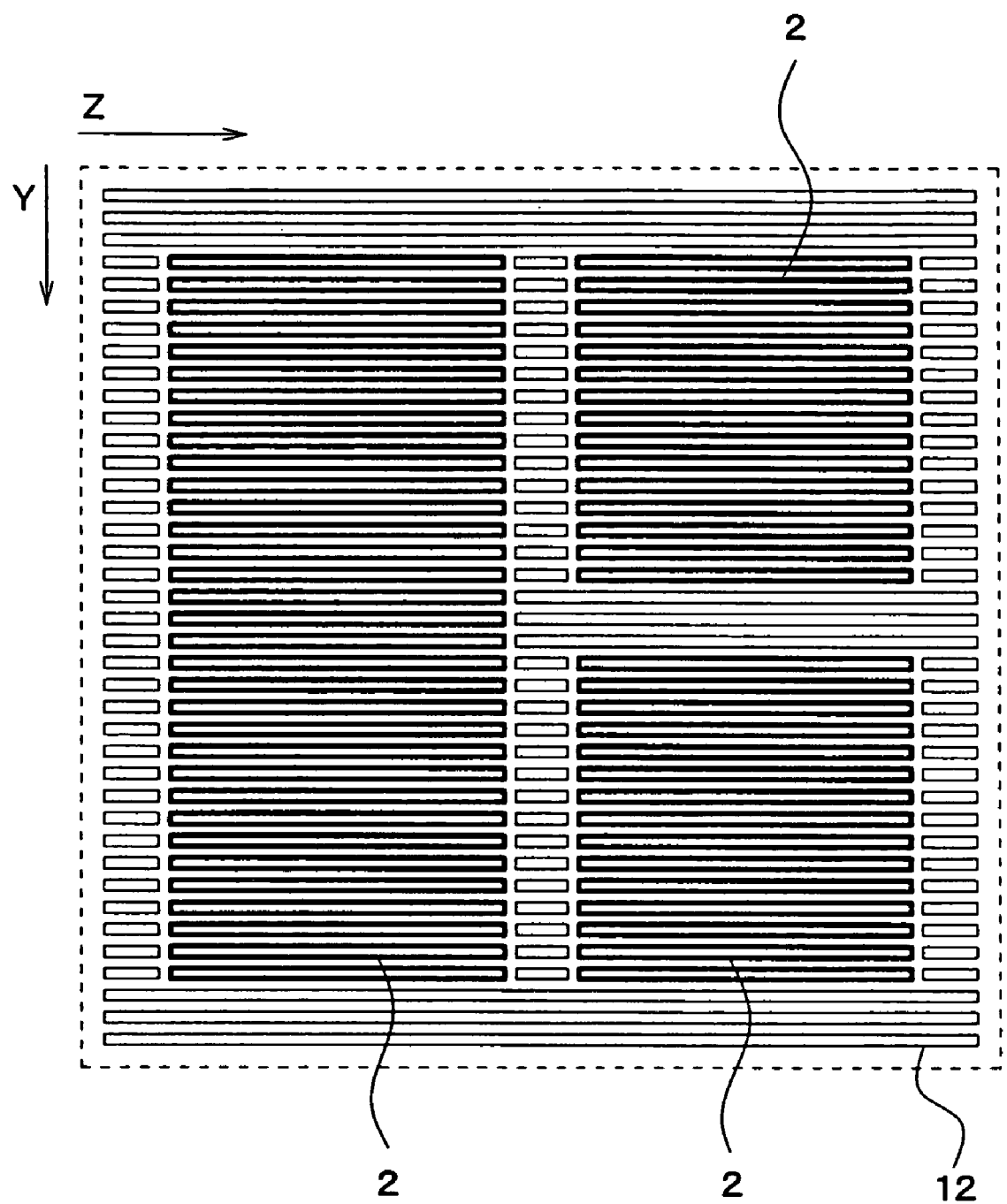
FIG. 14 is a plan view showing a trench and a dummy trench in a semiconductor device according to a first modification of the sixth embodiment of the present invention.
Figure 15:
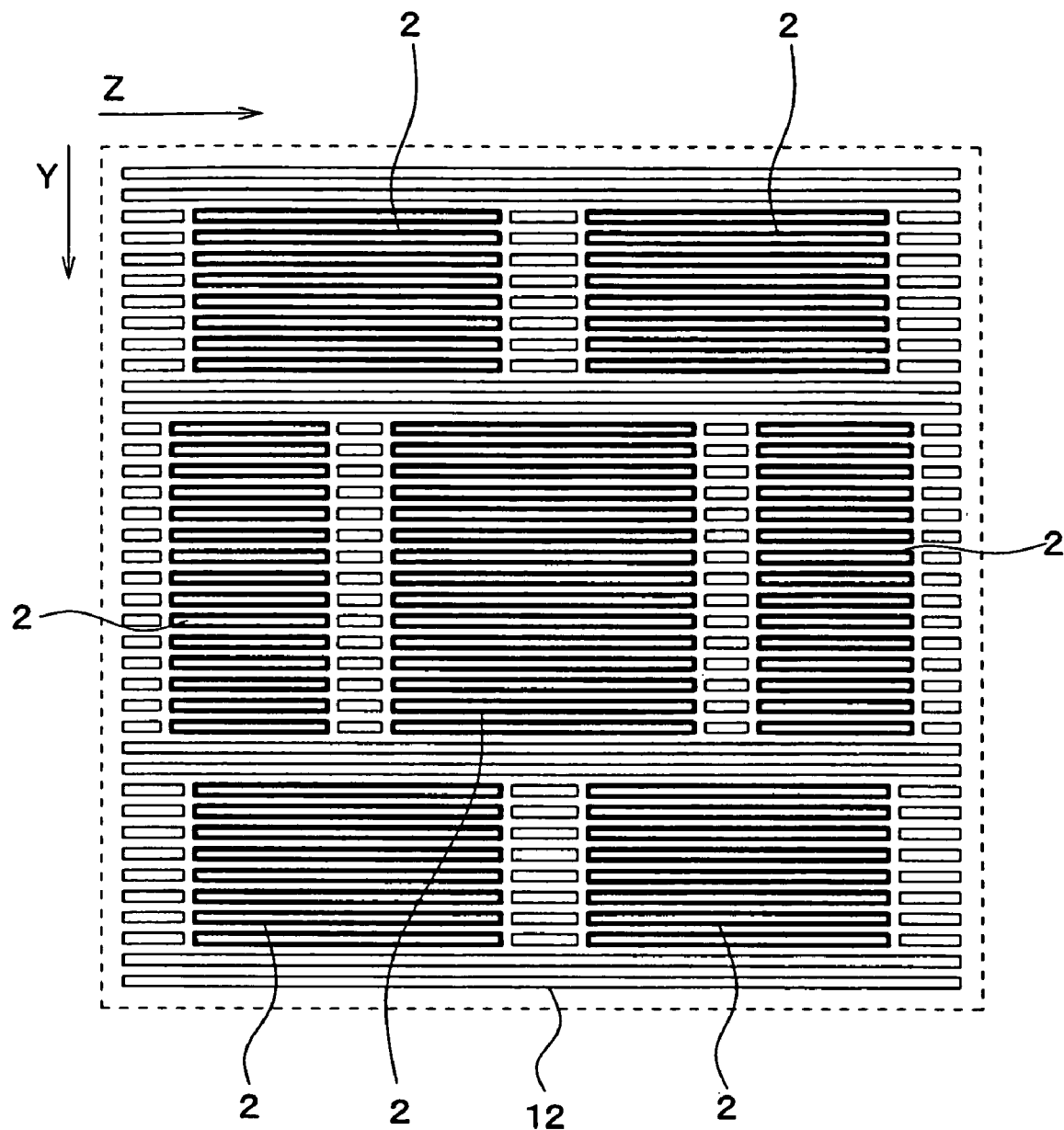
FIG. 15 is a plan view showing a trench and a dummy trench in a semiconductor device according to a second modification of the sixth embodiment of the present invention.

While all the four separated regions are made to have the same size, and the trenches 2 and the dummy trenches 12 are in the line-symmetric layout with respect to two axes in the embodiment, all the regions need not necessarily have the same size, and the trenches and the dummy trenches may be in a line-symmetric layout with respect to only one axis rather than two axes. For example, other layouts as shown in FIG. 14 and FIG. 15 can be used.

Seventh Embodiment

A seventh embodiment of the invention is described. In the embodiment, when a plurality of different semiconductor devices are formed in one shot of a wafer, the first to sixth embodiments are used.

Generally, one chip or a plurality of chips having the same size formed in a wafer is assumed to be corresponding to one shot, and each chip is in the same layout configuration. However, several chips having different size can be disposed in one shot so that several types of semiconductor devices are formed.

Figure 16A:
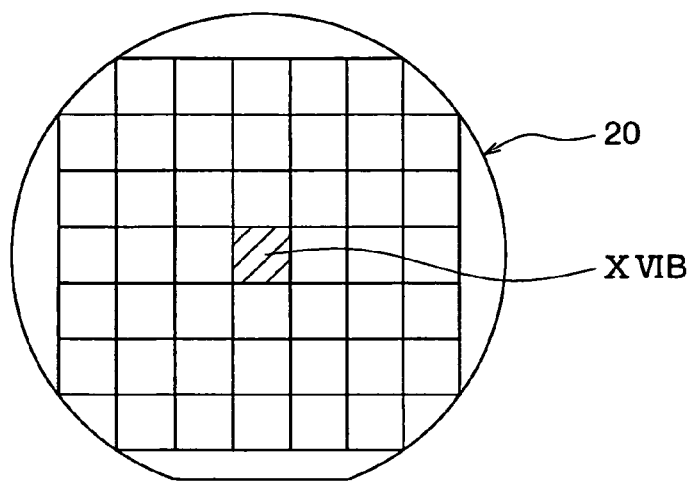
FIG. 16A is a plan view showing a shot map of a wafer, according to a seventh embodiment of the present invention.
Figure 16B:
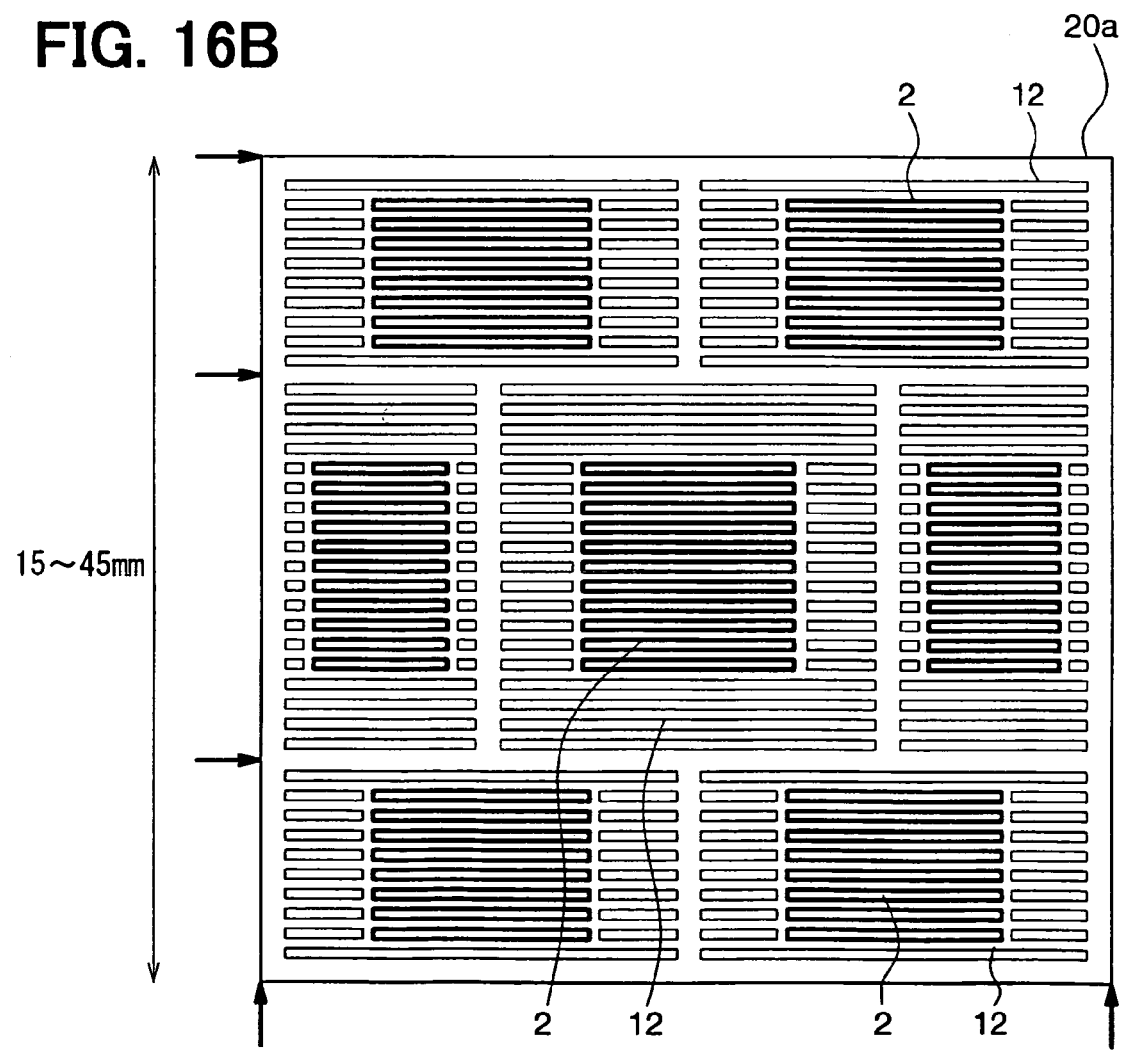
FIG. 16B is a partially enlarged plan view showing a region XVIB in FIG. 16A.

FIG. 16A is a view showing a shot map in a wafer 20, and FIG. 16B is an expanded view of one shot 20a in FIG. 16A.

As shown in FIG. 16A, the wafer 20 is partitioned into a plurality of shots 20a, and the same pattern is formed for each of the shots 20a. In the embodiment, as shown in FIG. 16B, not only outer edges of respective shots 20 but also insides of them (all portions shown by arrows in the figure) are formed as scribing lines shown as arrows in FIG. 16B, so that a plurality of semiconductor devices are configured. The power MOSFETs formed by using the trenches 2 are formed in each of the semiconductor devices, and the dummy trenches 12 are formed such that they enclose the element region configured by the aggregate of the trenches 2.

Each of the scribing lines has a fixed width, and a semiconductor device having a large element region among the respective semiconductor devices is disposed in the center of the shot 20a.

While only a layout for one shot is shown in FIG. 16B, for other shots, several chips having different size are similarly laid out to be in the same layout as the layout of the shot shown in FIG. 16B.

In this way, when several types of semiconductor devices are formed in each of the shots 20a, the first to sixth embodiments can be also used. In such a case, each of the shots 20a has the same layout. According to this, even if chip size is different, deviation of the shots 20a is eliminated in the wafer 20, and consequently uniform flow of the deposition gas is given and difference in growth rate between the respective impurity layers can be reduced.

Furthermore, in each of the shots 20a, the element regions having the different sizes and the dummy trenches 12 are in a line-symmetric relationship with a bisector parallel in the Y direction or Z direction respectively, thereby deviation in size of a pattern in a wafer plane can be eliminated, therefore more uniform flow of the deposition gas can be given when the impurity layers are formed in the trenches 2 and the dummy trenches 12, and consequently difference in growth rate between the layers can be reduced. Therefore, thickness variation in each of the impurity layers formed in the trenches 2 and the dummy trenches 12 of respective semiconductor devices in each of the shots 20a can be eliminated.

Eighth Embodiment

An eighth embodiment of the invention is described. In the embodiment, when the semiconductor device shown in each of the embodiments is manufactured, the dummy trenches 12 are formed even in the scribing regions used when each of the semiconductor devices is divided into chips. While description is made below using a case that the semiconductor device of the first embodiment is manufactured as an example, the embodiment can be applied to any of the above embodiments.

Figure 17:
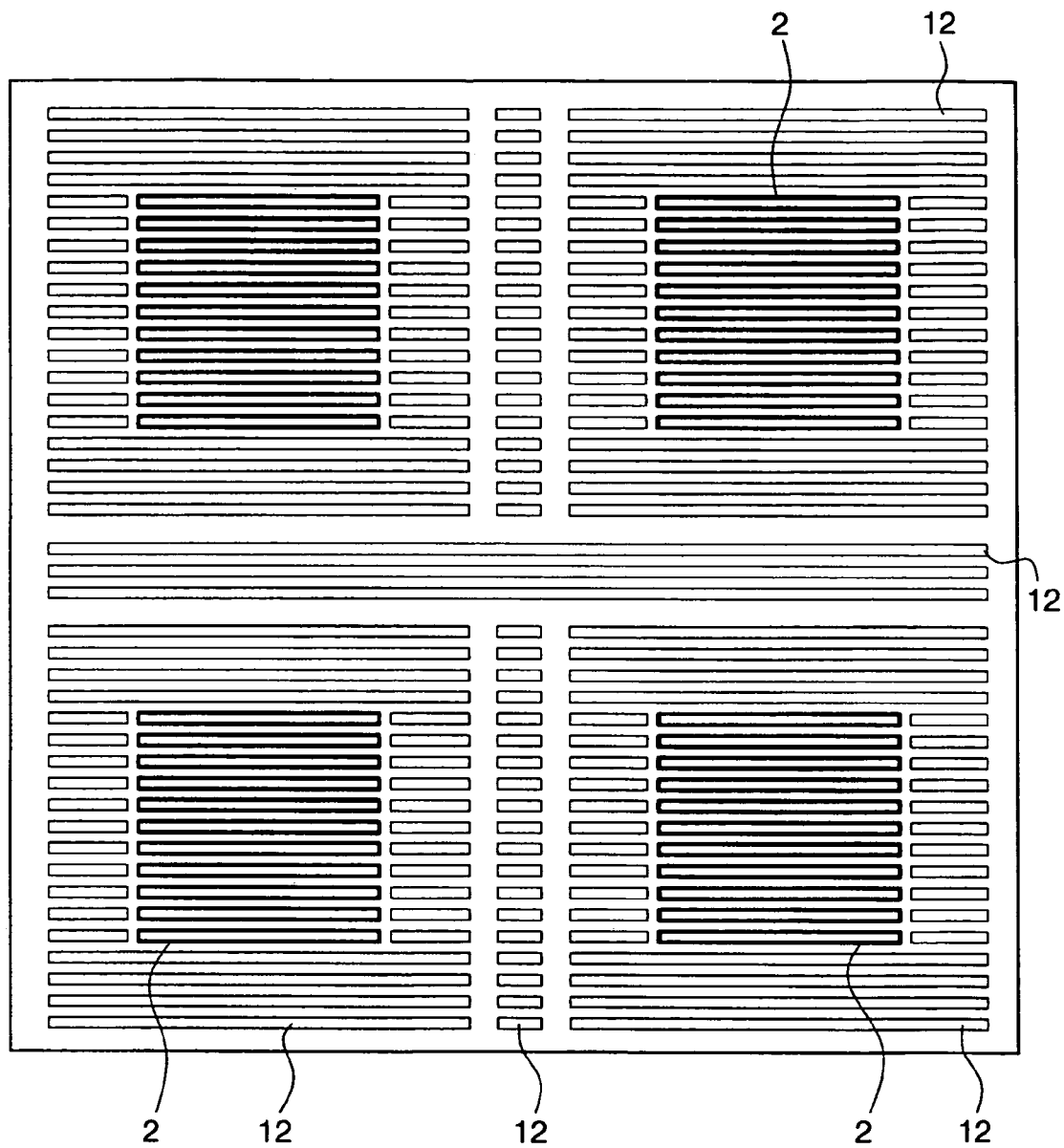
FIG. 17 is a plan view showing a trench and a dummy trench in a semiconductor device according to an eighth embodiment of the present invention.

FIG. 17 is a view showing a layout of the trenches 2 and the dummy trenches 12 in the case that four semiconductor devices of the first embodiment are formed in one shot 20a in the wafer 20.

As shown in the figure, the dummy trenches 12 are formed even in the scribing regions (for example, 20 to 100 μm in width) used when each of chips is divided. When the dummy trenches 12 are formed even in the scribing regions in this way, thickness variation in each of the impurity layers formed in the trenches 2 can be further eliminated even in a position near the scribing regions in the element region.

Again in the case that the dummy trenches 12 are formed in the scribing regions in this way, the semiconductor devices are manufactured by the same method as in the first embodiment, and then the semiconductor devices are divided in chips by dicing cutting, thereby chips configuring respective semiconductor devices are formed, however, the scribing regions are cut off, thereby the dummy trenches 12 formed in the scribing regions are eliminated.

While description is made using a case that a longitudinal direction of the dummy trenches 12 formed in the scribing regions corresponds to a longitudinal direction of the trenches 2 provided in respective semiconductor devices, that is, a cast that the two directions are parallel as an example, the two directions can be perpendicular to each other. For example, when all of respective sidewalls of the dummy trenches 12 are set to have a plane direction of (100), since the respective sidewalls are in the same plane direction, even if the longitudinal direction of the dummy trenches 12 in the scribing regions are corresponding to the longitudinal direction of the trenches 2, or perpendicular to it, a growth rate of each of the impurity layers formed therein is the same. Therefore, the longitudinal direction of the dummy trenches 12 in the scribing regions may be perpendicular to the longitudinal direction of the trenches 2 provided in each of the semiconductor devices.

Ninth Embodiment

A ninth embodiment of the invention is described. In the embodiment, with respect to each of the embodiments, the dummy trenches 12 are further formed even in outer circumferential portions of the wafer, that is, even in regions that are not made into chips. While description is made below using a case that the dummy trenches 12 are further formed even in the outer circumferential portions of the wafer with respect to the eighth embodiment as an example, the embodiment can be applied to any of the above embodiments.

Figure 18A:
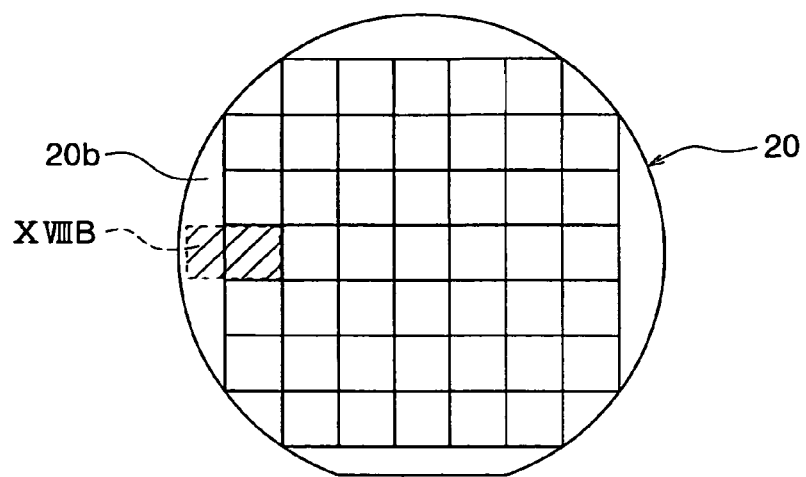
FIG. 18A is a plan view showing a shot map of a wafer, according to a ninth embodiment of the present invention.
Figure 18B:
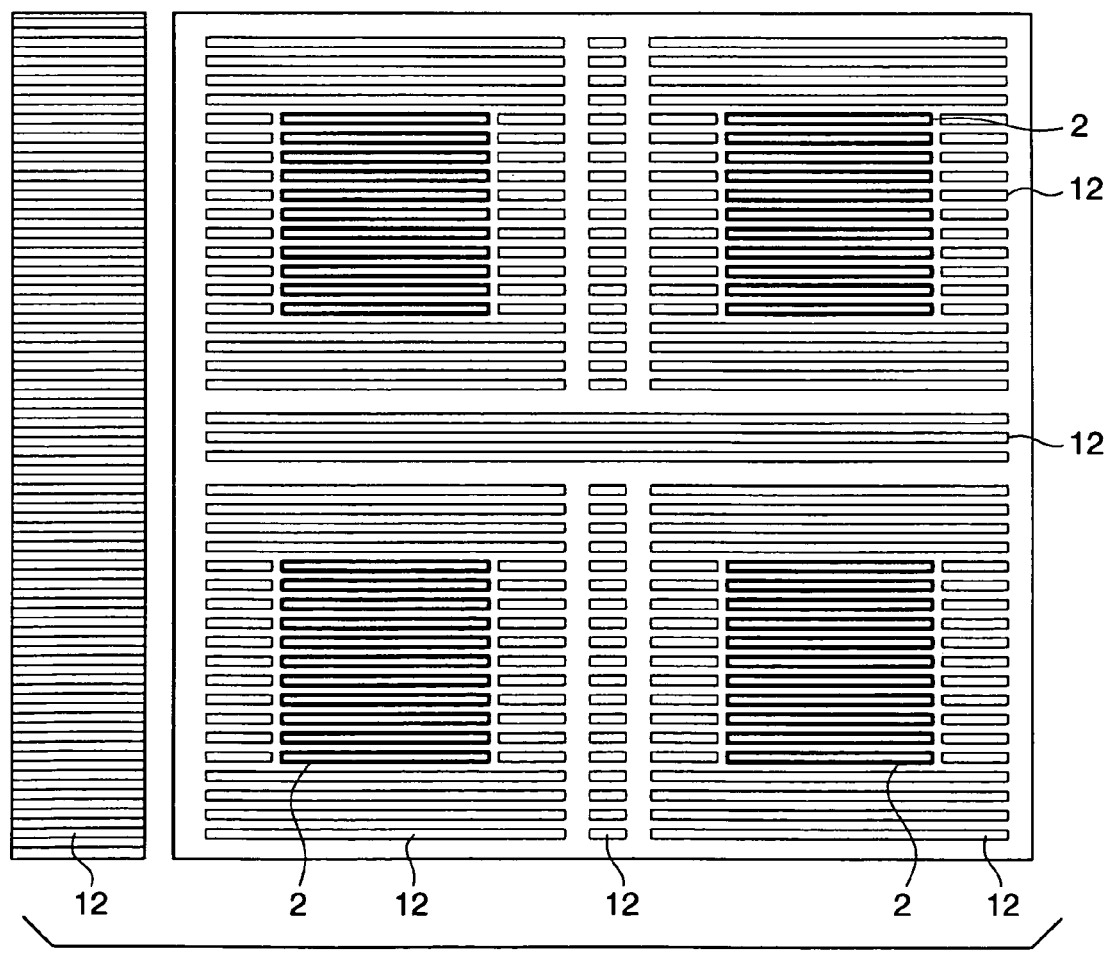
FIG. 18B is a partially enlarged plan view showing a region XVIIIB in FIG. 18A.

FIG. 18A is a view showing a shot map in the wafer 20, and FIG. 18B is an expanded view of a broken line area XVIIIB in FIG. 18A. As shown in FIG. 18A, the wafer 20 is partitioned into a plurality of shots 20a, and the same pattern is formed for each of the shots 20a. In the embodiment, as shown in FIG. 18B, the dummy trenches 12 are formed even in regions adjacent to the shots 20a in the outer circumferential portions 20b of the wafer 20.

When the dummy trenches 12 are formed even in the outer circumferential portions 20b of the wafer 20 in this way, thickness variation in each of the impurity layers formed in the trenches 2 can be further eliminated even in a position near the outer circumferential portions 20b in the element region.

Again in the case that the dummy trenches 12 are formed in the outer circumferential portions 20b in this way, the semiconductor devices are manufactured in the same method as in the first embodiment, and then the semiconductor devices are divided in chips by dicing cutting, thereby chips configuring respective semiconductor devices are formed, however, the outer circumferential portions 20b of the wafer 20 are cut off, thereby the dummy trenches 12 formed in the outer circumferential portions 20b are eliminated.

(Modifications)

While each of the impurity layers formed in the dummy trenches 12 is made to be in the electric floating state in the embodiments, it need not be always made to be in the floating state. That is, each of the impurity layers may be electrically connected to any one site to be clamped to electrical potential of the site. However, as described before, in the light of occurrence of leakage current through each of the impurity layers formed in the dummy trenches 12, or possibility of occurrence of electric noise when momentary voltage is externally applied, each of the impurity layers that does not act as a device is preferably made to be in the floating state.

While the n-channel-type power MOSFET was shown as an example of the semiconductor element in the embodiments, an embodiment of the invention can be naturally applied to a p-channel-type power MOSFET. In addition, the embodiment of the invention can be applied to other elements such as a semiconductor element that can be realized by forming the trenches 2 in a semiconductor substrate, and then depositing a plurality of impurity layers in the trenches 2, for example, IGBT or a diode.

While description was made using an example where the silicon substrate is used as the semiconductor substrate in the embodiments, it merely means that the embodiment of the invention is suitable for silicon semiconductor, and a semiconductor substrate configured by another semiconductor material may be used.

The semiconductor device is used for an insulating gate semiconductor device such as a power-MOS transistor, IGBT, and a thyristor.

The present disclosure has the following features.

According to a first feature of an embodiment of the disclosure, a semiconductor device includes: a semiconductor substrate; an element region having a semiconductor element, which includes an impurity layer and a trench, wherein the impurity layer is disposed in the trench, wherein the impurity layer includes an epitaxial impurity layer, and wherein the trench is disposed on a main surface of the semiconductor substrate; and a field region disposed around the element region. The trench is an aggregation of a plurality of stripe line trenches so that the element region has a polygonal shape. The field region includes a dummy trench disposed on a periphery of the element region. The dummy trench is disposed along with at least one side of the polygonal shape on the periphery of the element region. The dummy trench has a width substantially equal to a width of the trench in the element region. The dummy trench has a longitudinal direction substantially equal to a longitudinal direction of the trench in the element region. The field region further includes an impurity layer disposed in the dummy trench. The impurity layer of the field region includes an epitaxial impurity layer.

In the above device, trenches for element formation are formed as an aggregate where a plurality of the trenches are arranged in a stripe pattern, thereby an element region is made to have a polygon shape; and in a field region, dummy trenches having the same width as the trenches for element formation and the same longitudinal direction as a longitudinal direction of the trenches for element formation are formed in a manner of running along at least one side of an outer edge of the element region in a site situated in the outer edge of the element region in the field region, and impurity layers are formed even in the dummy trenches.

In this way, when the dummy trenches having the same width as the trenches for element formation and the same longitudinal direction as the longitudinal direction of the trenches for element formation are formed in a manner of running along at least the one side of the outer edge of the element region in the site situated in the outer edge of the element region in the field region, even if thickness variation occurs in the impurity layers formed in a dummy trench, thickness variation in the impurity layers formed in trenches for element formation situated inside the relevant dummy trench can be reduced or eliminated. Thus, finished shapes of the impurity layers can be made uniform, and consequently characteristic of a semiconductor element can be made uniform. The semiconductor device can suppress variation in thickness of the impurity layers formed in the trenches.

Alternatively, the impurity layer in each of the element region and the field region may be a multi-layer structure including a plurality of layers, one of which has a first conductive type, and another one of which has a second conductive type.

Alternatively, the semiconductor element in the element region may include: a drift layer having a first conductive type and disposed in the trench of the element region; a base layer having a second conductive type and disposed on the drift layer; a source layer having the first conductive type and disposed on the base layer; a MOS gate trench disposed on the main surface of the semiconductor substrate and penetrating the source layer and the base layer so that the MOS gate trench reaches the drift layer; a gate insulation film disposed on an inner wall of the MOS gate trench; a gate electrode disposed in the MOS gate trench through the gate insulation film; a source electrode electrically connecting to the source layer and the base layer; and a drain electrode electrically connecting to the semiconductor substrate. The drift layer, the base layer and the source layer are provided by the impurity layer. Both of the drift layer and the base layer are provided by the epitaxial impurity layer.

Specifically, in the above case, the semiconductor device has a MOS transistor as the semiconductor element, which includes a drift region in a first conduction type formed in the trench for element formation, a base region in a second conduction type formed on the drift region, a source region in a first conduction type formed on the base region, a MOS gate trench running from a main surface 1a side of a semiconductor substrate to the drift region through the source region and the base region, a gate insulating film formed on a surface of the MOS gate trench, a gate electrode formed on a surface of the gate insulating film as a gate oxidation film, a source electrode to be electrically connected to the source region and the base region, and a drain electrode to be electrically connected to the semiconductor substrate. In this case, the drift region, base region, and source region are configured as the impurity layers, and at least the drift region and the base region among them are formed by epitaxial growth.

Alternatively, the dummy trench may surround all of the periphery of the element region.

Alternatively, the dummy trench may include a plurality of stripe line trenches, which are aligned to be a stripe shape. Thus, in this case, the dummy trenches are arranged in a stripe pattern. In this case, the thickness variation in the impurity layers (3, 4 and 5) formed in the trenches (2) for element formation situated inside the plurality of dummy trenches (12) can be reduced or eliminated.

Alternatively, the trench in the element region may have a distance between two adjacent stripe line trenches of the trench. The dummy trench in the field region may have a distance between two adjacent stripe line trenches of the dummy trench. The distance of the trench in the element region is substantially equal to the distance of the dummy trench in the field region. Specifically, in this case, an interval between the trenches for element formation arranged in the stripe pattern is even with an interval between the dummy trenches arranged in the stripe pattern.

Alternatively, the dummy trench in the field region may have a longitudinal direction, which coincides with the longitudinal direction of the trench in the element region, and the dummy trench in the field region may connect to the trench in the element region. Specifically, in this case, the dummy trenches can be formed by further extendedly setting the trenches for element formation in a longitudinal direction such that the dummy trenches and the trenches for element formation are connected.

Alternatively, the dummy trench in the field region may have a longitudinal direction, which coincides with the longitudinal direction of the trench in the element region, and the dummy trench in the field region may be separated by a predetermined clearance from the trench in the element region. Specifically, in this case, the dummy trenches can be formed by further extendedly setting the trenches for element formation in a longitudinal direction such that the dummy trenches and the trenches for element formation are separated with a predetermined interval d.

Alternatively, the trench in the element region may be separated into a plurality of parts in the longitudinal direction of the trench, and the dummy trench in the field region may be separated into a plurality of parts in a longitudinal direction of the dummy trench. Specifically, in this case, both of the trenches for element formation and the dummy trenches can be separated into several sections in longitudinal directions of them. In this way, length in the longitudinal directions of the trenches for image formation and the dummy trenches is reduced, thereby sidewalls of the trenches for element formation and the dummy trenches can be prevented from falling down.

Alternatively, the device may further include a bisector for dividing the device into two parts. The trench in the element region and the dummy trench in the field region have a line symmetry with the bisector as a center line. Specifically, in this case, the trenches for element formation and the dummy trenches can be configured to be separated into several sections such that they are in line symmetry with a bisector of a chip in which the semiconductor element is formed as a center, respectively. In this way, when a layout where both trenches are in line symmetry with the bisector of the chip as the center is made, when each of the impurity layers is deposited in the trenches for element formation, uniform flow of a deposition gas is given, and consequently difference in growth rate can be reduced.

Alternatively, the element region may further include a plurality of parts, and each part of the element region is surrounded with the dummy trench. Specifically, in this case, even in a case that a plurality of element regions exist, each of the plurality of element regions may be enclosed by the dummy trenches.

Alternatively, each part of the element region may have same dimensions, i.e., a plurality of element regions has the same size. In this way, each of separated regions is made to have the same size, thereby when each of the impurity layers is deposited in the trenches for element formation, uniform flow of the deposition gas is given, and consequently difference in growth rate can be reduced. Thus, for example, when semiconductor elements formed in respective, separated regions are desired to be used with being connected in parallel, characteristics of the semiconductor elements in respective regions become uniform, and consequently deviation in current flow can be eliminated.

Alternatively, each part of the element region may have a same clearance between the part of the element region and the dummy trench. Specifically, in this case, when the plurality of element regions are given in this way, distances between respective element regions and the dummy trenches are preferably made to be uniform.

Alternatively, each part of the element region may have a clearance between the part of the element region and the dummy trench. Each part of the element region may have a second clearance between two adjacent parts of the element region. Each part of the dummy trench may have a third clearance between two adjacent parts of the dummy trench. The first clearance, the second clearance and the third clearance are substantially the same. Specifically, all intervals between respective separated element regions, between respective separated dummy trenches, and between element regions and dummy trenches, which are adjacent to each other in the element regions and the dummy trenches, are made to be uniform.

Alternatively, the impurity layer in the dummy trench of the field region may be electrically in a floating state. Specifically, the impurity layers formed in the dummy trenches can be made to be in an electrical floating state. When the impurity layers formed in the dummy trenches are made to be in the electrical floating state in this way, occurrence of leakage current through each of the impurity layers formed in the dummy trenches, or influence of electric nose occurring when momentary voltage is externally applied can be prevented.

Alternatively, the element region may further include an insulation film covering the main surface of the semiconductor substrate and disposed on the trench. The field region further includes an oxide film covering the main surface of the semiconductor substrate and disposed on at least a part of the dummy trench. The oxide film in the field region has a thickness larger than a thickness of the insulation film in the element region. Specifically, a thick oxide film is formed on the dummy trenches, thereby when wiring and the like are placed on the oxide film, withstanding voltage between the wiring and the substrate can be secured.

According to a second feature of the embodiment of the disclosure, a method for manufacturing a semiconductor device includes the steps of: preparing a semiconductor wafer having a plurality of chips and a scribe region thereon, wherein the chips is to be separated by the scribe region into individual chips, wherein each chip includes a element region and a field region disposed around the element region; forming a trench in the element region in such a manner that the trench is formed to be an aggregation of a plurality of stripe line trenches so that the element region has a polygonal shape;

forming a dummy trench in the field region in such a manner that the dummy trench is disposed along with at least one side of the polygonal shape of the trench on a periphery of the element region, wherein the dummy trench in the field region has a width substantially equal to a width of the trench in the element region, wherein the dummy trench has a longitudinal direction substantially equal to a longitudinal direction of the trench in the element region, and wherein the step of forming the trench in the element region and the step of forming the dummy trench in the field region are performed simultaneously; and forming an impurity layer in the trench in the element region and in the dummy trench in the field region by an epitaxial growth method.

Specifically, in the above method, a step of preparing a semiconductor wafer; a step of forming the trenches for element formation as an aggregate in which a plurality of the trenches are arranged in a stripe pattern in an element region to be made into a chip in the semiconductor wafer, thereby configuring the element region in a polygonal shape, and concurrently with this, forming the dummy trenches having the same width as the trenches for element formation and the same longitudinal direction as a longitudinal direction of the trenches for element formation in a manner of running along at least one side of an outer edge of the element region in a field region to be made into the chip; and a step of forming the impurity layers using epitaxial growth in the trenches for element formation and the dummy trenches are included.

In this way, the trenches for element formation and the dummy trenches can be formed at the same time, and the impurity layers can be formed at the same time in them. The impurity layers are formed also in the dummy trenches in this way, thereby even if thickness variation occurs in the impurity layers formed in a dummy trench, thickness variation in impurity layers formed in trenches for element formation situated inside the relevant dummy trench can be reduced or eliminated. Thus, the finished shapes of the impurity layers can be made uniform, and consequently the characteristic of the semiconductor element can be made uniform.

Alternatively, the wafer may further include a plurality of shots having a plurality of chips, each of which has different dimensions. Each shot has a predetermined layout of the chips, and the layout of each shot is the same. Specifically, in this case, a plurality of chips having different chip size disposed in a predetermined layout are assumed to be one shot, and respective shots in the semiconductor wafer are in the same layout. According to this, deviation of the shots in the wafer is eliminated even if the chip size is different, therefore uniform flow of a deposition gas is given, and consequently difference in growth rate between the impurity layers can be reduced. Therefore, thickness variation in each of the impurity layers in respective shots can be reduced or eliminated.

Alternatively, in the step of forming the dummy trench, the dummy trench may be formed in the scribe region. Specifically, the trenches for element formation and the dummy trenches are formed in the chip, and concurrently with this, the dummy trenches are formed also inscribing regions. When the dummy trenches are formed also in the scribing regions in this way, thickness variation in each of the impurity layers formed in the trenches for element formation can be further eliminated even in a position near the scribing regions in the element region.

Alternatively, in the step of forming the dummy trench, the dummy trench may be formed in a wafer periphery portion in such a manner that the dummy trench is disposed along with a periphery of the chip, and the wafer periphery portion is not used for the chip. Specifically, the trenches for element formation and the dummy trenches are formed in the chip, and concurrently with this, the dummy trenches are formed also in an outer circumferential portion of the semiconductor wafer corresponding to an area which is not made into the chip in the wafer in a manner of running along the outer edge of the chip. When the dummy trenches are formed also in the outer circumferential portion of the semiconductor wafer in this way, thickness variation in each of the impurity layers formed in the trenches for element formation can be further eliminated even in a position near the outer circumferential portion (20b) in the element region.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate;
   an element region having a semiconductor element, which includes an impurity layer and a trench, wherein the impurity layer is disposed in the trench, wherein the impurity layer includes an epitaxial impurity layer, and wherein the trench is disposed on a main surface of the semiconductor substrate; and
   a field region disposed around the element region, wherein
   the trench is an aggregation of a plurality of stripe line trenches so that the element region has a polygonal shape,
   the field region includes a dummy trench disposed on a periphery of the element region,
   the dummy trench is disposed along with at least one side of the polygonal shape on the periphery of the element region,
   the dummy trench has a width substantially equal to a width of the trench in the element region,
   the dummy trench has a longitudinal direction substantially equal to a longitudinal direction of the trench in the element region,
   the field region further includes an impurity layer disposed in the dummy trench
   the impurity layer of the field region includes an epitaxial impurity layer,
   the semiconductor element in the element region includes:
     a drift layer having a first conductive type and disposed in the trench of the element region;
     a base layer having a second conductive type and disposed on the drift layer;
     a source layer having the first conductive type and disposed on the base layer;
     a MOS gate trench disposed on the main surface of the semiconductor substrate and penetrating the source layer and the base layer so that the MOS gate trench reaches the drift layer;
     a gate insulation film disposed on an inner wall of the MOS gate trench;
     a gate electrode disposed in the MOS gate trench through the gate insulation film;
     a source electrode electrically connecting to the source layer and the base layer and
     a drain electrode electrically connecting to the semiconductor substrate;
   the drift layer, the base layer and the source layer are provided by the impurity layer, both of the drift layer and the base layer are provided by the epitaxial impurity layer, the impurity layer in the dummy trench only includes the drift layer, the base layer and the source layer without including the MOS gate trench, and the source electrode is not connected to the source layer in the dummy trench so that the drift layer, the base layer and the source layer in the dummy trench are respectively isolated from the drift layer, the base layer and the source layer in the trench.

2. The device according to claim 1, wherein the dummy trench surrounds all of the periphery of the element region.

3. The device according to claim 1, wherein the dummy trench includes a plurality of stripe line trenches, which are aligned to be a stripe shape.

4. The device according to claim 3, wherein the trench in the element region has a distance between two adjacent stripe line trenches of the trench, the dummy trench in the field region has a distance between two adjacent stripe line trenches of the dummy trench, and the distance of the trench in the element region is substantially equal to the distance of the dummy trench in the field region.

5. The device according to claim 1, wherein the dummy trench in the field region has a longitudinal direction, which coincides with the longitudinal direction of the trench in the element region, and the dummy trench in the field region connects to the trench in the element region.

6. The device according to claim 1, wherein the dummy trench in the field region has a longitudinal direction, which coincides with the longitudinal direction of the trench in the element region, and the dummy trench in the field region is separated by a predetermined clearance from the trench in the element region.

7. The device according to claim 1, wherein the trench in the element region is separated into a plurality of parts in the longitudinal direction of the trench, and the dummy trench in the field region is separated into a plurality of parts in a longitudinal direction of the dummy trench.

8. The device according to claim 7, further comprising:

a bisector for dividing the device into two parts, wherein the trench in the element region and the dummy trench in the field region have a line symmetry with the bisector as a center line.

9. The device according to claim 1, wherein the element region farther includes a plurality of parts, and each part of the element region is surrounded with the dummy trench.

10. The device according to claim 8, wherein each part of the element region has same dimensions.

11. The device according to claim 8, wherein each part of the element region has a same clearance between the part of the element region and the dummy trench.

12. The device according to claim 8, wherein each part of the element region has a clearance between the part of the element region and the dummy trench, each part of the element region has a second clearance between two adjacent parts of the element region, each part of the dummy trench has a third clearance between two adjacent parts of the dummy trench, and the first clearance, the second clearance and the third clearance are substantially the same.

13. The device according to claim 1, wherein the impurity layer in the dummy trench of the field region is electrically in a floating state.

* * * * *